(12) United States Patent
Bammes et al.

(10) Patent No.: US 11,310,438 B2
(45) Date of Patent: Apr. 19, 2022

(54) SYSTEM, APPARATUS, AND METHOD FOR DETERMINING ELEMENTAL COMPOSITION USING 4D STEM

(71) Applicant: Direct Electron, LP, San Diego, CA (US)

(72) Inventors: Benjamin Bammes, Pearland, TX (US); Robert Bilhorn, San Diego, CA (US)

(73) Assignee: Direct Electron, LP, San Diego, CA (US)

( * ) Notice: Subject to any disclaimer, the term of this patent is extended or adjusted under 35 U.S.C. 154(b) by 0 days.

(21) Appl. No.: 16/851,835

(22) Filed: Apr. 17, 2020

(65) Prior Publication Data
US 2020/0335301 A1 Oct. 22, 2020

Related U.S. Application Data

(60) Provisional application No. 62/836,555, filed on Apr. 19, 2019.

(51) Int. Cl.
*H04N 5/235* (2006.01)
*H04N 5/365* (2011.01)
(Continued)

(52) U.S. Cl.
CPC ............ *H04N 5/2355* (2013.01); *H01J 37/28* (2013.01); *H04N 5/00* (2013.01); *H04N 5/341* (2013.01);
(Continued)

(58) Field of Classification Search
CPC ...... H04N 5/2355; H04N 5/00; H04N 5/3655; H04N 5/341; H04N 5/3532; H04N 5/217;
(Continued)

(56) References Cited

U.S. PATENT DOCUMENTS

| 8,135,230 B2 | 3/2012 | Rempel et al. |
| 8,933,401 B1 | 1/2015 | Reed |

(Continued)

OTHER PUBLICATIONS

International Search Report and Written Opinion dated Aug. 19, 2020 in PCT/US2020/028814, 16 pages.
(Continued)

*Primary Examiner* — Jason L McCormack
(74) *Attorney, Agent, or Firm* — Oblon, McClelland, Maier & Neustadt, L.L.P.

(57) ABSTRACT

The present disclosure relates to transmission electron microscopy for evaluation of biological matter. According to an embodiment, the present disclosure further relates to an apparatus for determining the structure and/or elemental composition of a sample using 4D STEM, comprising a direct bombardment detector operating with global shutter readout, processing circuitry configured to acquire images of bright-field disks using either a contiguous array or non-contiguous array of detector pixel elements, correct distortions in the images, align each image of the images based on a centroid of the bright-field disk, calculate a radial profile of the images, normalize the radial profiles by a scaling factor, calculate the rotationally-averaged edge profile of the bright-field disk, and determine elemental composition within the specimen based on the characteristics of the edge profile of the bright-field disk corresponding to each specimen location.

7 Claims, 19 Drawing Sheets

(51) Int. Cl.
  *H04N 5/341* (2011.01)
  *H01J 37/28* (2006.01)
  *H04N 5/00* (2011.01)
(52) U.S. Cl.
  CPC .. *H04N 5/3655* (2013.01); *H01J 2237/24592* (2013.01); *H01J 2237/2806* (2013.01); *H01J 2237/2817* (2013.01)
(58) Field of Classification Search
  CPC ... H04N 5/23245; H04N 5/3456; H01J 37/28; H01J 37/244; H01J 2237/24592; H01J 2237/2806; H01J 2237/2817; H01J 2237/2441; H01J 2237/2446; G01N 2223/6126; G01N 23/2251
  USPC .......................................... 250/306, 307, 311
  See application file for complete search history.

(56) References Cited

U.S. PATENT DOCUMENTS

| | | |
|---|---|---|
| 9,432,589 B2 | 8/2016 | Kuang et al. |
| 9,696,435 B2 | 7/2017 | Gubbens et al. |
| 9,997,331 B1 | 6/2018 | Own et al. |
| 2007/0187597 A1* | 8/2007 | Suzuki ................ H01J 37/3005 250/310 |
| 2011/0284744 A1 | 11/2011 | Zewail et al. |
| 2012/0012747 A1 | 1/2012 | Lazar et al. |
| 2012/0287258 A1* | 11/2012 | Tsuneta ................ H01J 37/265 348/80 |
| 2014/0078314 A1* | 3/2014 | Dowski, Jr. ............ H04N 5/238 348/169 |
| 2014/0131574 A1 | 5/2014 | Zewail et al. |
| 2016/0041064 A1 | 2/2016 | Morishita |
| 2017/0005126 A1 | 1/2017 | Yamazaki et al. |
| 2017/0144787 A1 | 5/2017 | Kim |
| 2017/0329025 A1 | 11/2017 | Brown et al. |
| 2018/0337019 A1* | 11/2018 | Sagawa ................ H01J 37/244 |
| 2018/0342370 A1* | 11/2018 | Konyuba ................ G01N 1/32 |
| 2019/0295814 A1* | 9/2019 | Franken ................ H01J 37/28 |

OTHER PUBLICATIONS

Barnaby D. A. Levin, et al. "4D STEM with a Direct Electron Detector" Microscopy and Analysis, Jan. 30, 2020, 10 pages.

* cited by examiner

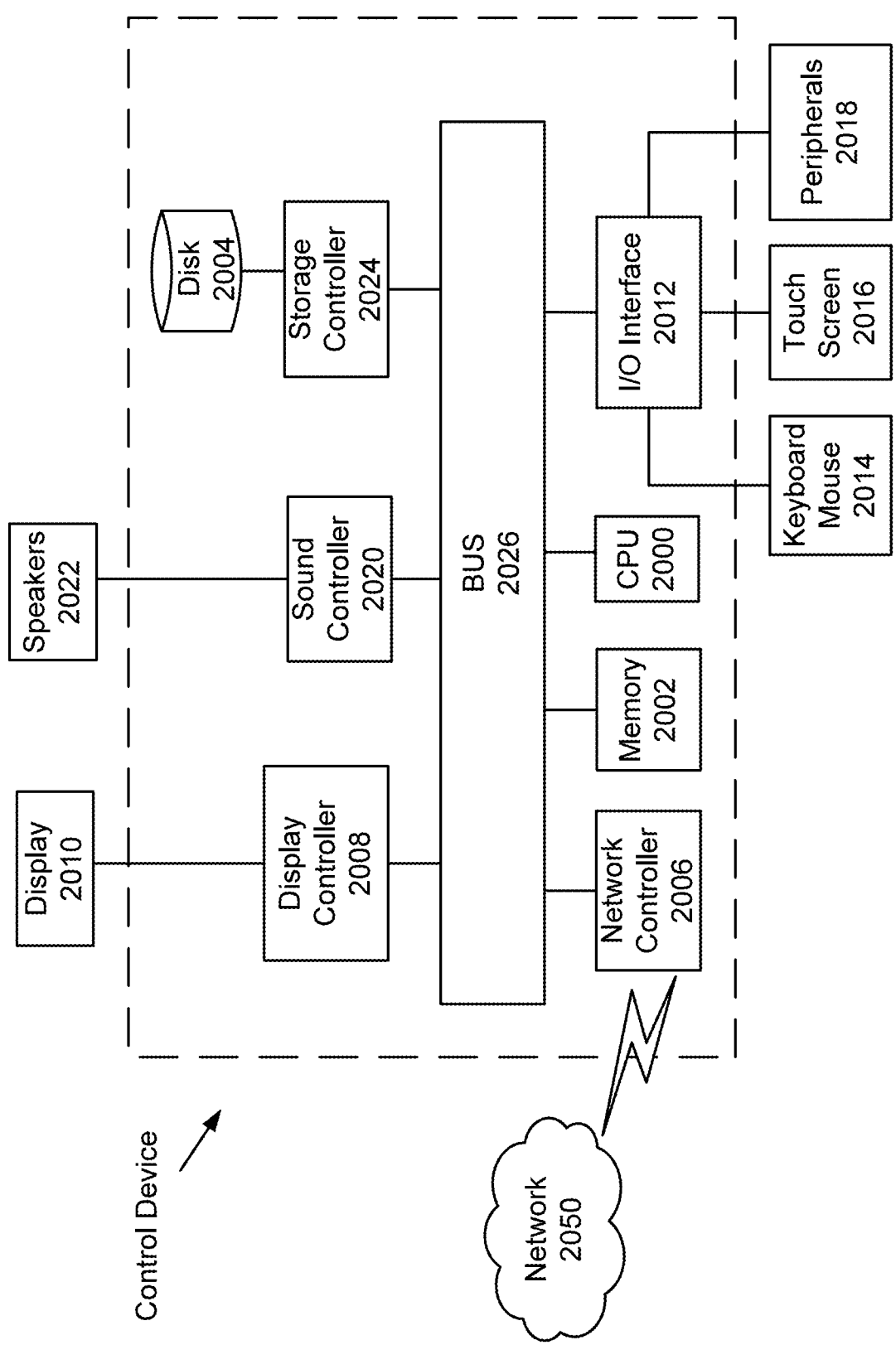

SYSTEM, APPARATUS, AND METHOD FOR DETERMINING ELEMENTAL COMPOSITION USING 4D STEM

CROSS-REFERENCE TO RELATED APPLICATIONS

The present application claims priority to U.S. Provisional Application No. 62/836,555, filed Apr. 19, 2019, the teaching of which is incorporated by reference herein in its entirety for all purposes.

STATEMENT REGARDING GOVERNMENT SUPPORT

This invention was made with government support under Award Number DE-SC0018493 awarded by United States Department of Energy, Office of Science. The government has certain rights to the invention.

BACKGROUND

Field of the Disclosure

The present disclosure relates to scanning transmission electron microscopy and evaluation of biological matter. Moreover, the present disclosure relates to a monolithic active pixel-array sensor operating in a synchronous readout mode. The present disclosure also relates to operation of the sensor in compressive sensing readout modes.

Description of the Related Art

For the past several decades, optical fluorescence microscopy has been the primary method for biological imaging of cells at a resolution of hundreds of nanometers. This technique uses autofluorescent proteins or small synthetic fluorescent probes to selectively label cellular constituents so they can be visually localized within a specimen. Such specific structural information is important to the development of biological sciences. The wavelength of visible light, however, limits the resolution of optical fluorescence microscopy to ~200 nanometers. While super-resolution techniques have pushed the resolution of fluorophore labels to higher resolutions, it is not possible to study an entire specimen at nanometer-scale resolution with optical microscopy. Thus, many critical cellular features can be obscured, including the separation of membranes and the locations of individual macromolecular assemblies.

Accordingly, imaging biological ultrastructures at higher resolutions (e.g., nano-scale) can be facilitated by transmission electron microscopy (TEM). However, unlike the lower-resolution technique of optical fluorescence microscopy, the ability to label and distinguish different kinds of cellular components in a single image is minimal with conventional TEM. TEM has thus presented a trade-off between 100× improved resolution and the inability to label and discriminate functional cellular components.

To this end, a combination of optical fluorescence microscopy with TEM, called correlated light and electron microscopy (CLEM), can address this deficiency when applied to the same specimen, but it is tedious and remains limited by the fact that fluorescent labels can still only be visualized at low-resolution.

Recent developments include "multi-color EM," which uses selective lanthanide-ion tagging and electron energy-loss filtered (EFTEM) to generate data analogous to multi-color fluorescence microscopy, but at ~100× improved magnification. For each targeted protein or cellular region, diaminobenzidine (DAB) conjugated with a specific lanthanide metal (La+3, Ce+3, or Pr+3) can be locally deposited and then the precise location of the lanthanide metal is discerned by obtaining an elemental map by collecting multiple EFTEM images at the characteristic core-loss edges for each element. While this technique intends to reveal novel structural information, it is often inefficient as it depends on a very small fraction of the electrons that interact with the specimen and that happen to lose a particular amount of energy. Additionally, each label must be acquired in separate images and the conventional TEM bright-field image must also be acquired. The inefficiency of this method makes it tedious and slow to execute, while producing noisy images that are challenging to unambiguously interpret, especially for thick cellular specimens.

Scanning transmission electron microscopy (STEM) is an alternative to conventional TEM bright-field and EFTEM imaging. Rather than illuminating the entire region-of-interest of the specimen to collect image data, STEM uses a focused electron beam to raster across the specimen region-of-interest. Various detectors are used to measure the interaction of the electron beam with each raster point on the specimen, resulting in the generation of one or more images of the specimen. These detectors are generally monolithic, such that each detector measures a single value—for example, the number of electrons that are scattered by the specimen to a certain angular range.

Recently four-dimensional STEM (4D STEM) has been developed as an extension to the conventional STEM technique. In 4D STEM, the monolithic detectors are replaced or supplemented by a pixel array detector, consisting of thousands to millions of individual detector elements, enabling more complex analysis including elucidation of local electromagnetic fields and crystallographic strain in the specimen. However, elemental discrimination, especially in relatively thick specimens such as those used in biology, has thus far not been possible with 4D STEM due to several deficiencies with current technology and methodologies.

First, conventional active pixel array detectors for electrons operate only in a rolling-shutter readout mode (i.e., non-synchronous mode), where the pixels across the array are acquired and readout at slightly different times. In many detectors, readout proceeds sequentially across the rows of the pixel array. Rolling shutter readout suffers from distortions of fast-moving objects or rapid flashes of light. For example, rolling shutter can cause effects such as wobble, skew, spatial aliasing, and temporal aliasing. For 4D STEM, rolling shutter causes significant problems. Because the timestamp of different groups of pixels (rows) differs with rolling shutter readout, it is impossible to synchronize the readout of the entire pixel array (all rows) with any single external event, such as the movement of a STEM probe on the specimen.

Second, conventional active pixel array detectors for electrons are generally too slow to perform 4D STEM data acquisition of large specimen areas without the deleterious effects of specimen drift. The frame rate of most pixel array detectors can be increased by reducing the number of pixels readout in each frame, so that, for example, only the central 25% of the pixels are readout. While ignoring some fraction of the pixels at the periphery of the pixel array increases the frame rate, doing so also reduces the range of scattering angles collected in the experiment. For 4D STEM techniques utilizing a broad range of scattering angles, choosing a smaller region-of-interest of the pixel array in order to boost speed is not practical.

Third, existing methods in 4D STEM are not sensitive to elemental composition in thick and heterogenous specimens, like those frequently used in biological applications. Elemental discrimination in STEM is facilitated through "Z-contrast", which is a single value based on the number of electrons scattered by the specimen at high scattering angles (called the high-angle dark field region). While Z-contrast is effective for imaging crystalline specimens with homogenous atomic columns, using this simple metric cannot discriminate elemental composition of mixtures.

The present disclosure describes a method that addresses the above-described deficiencies of current methodologies.

The foregoing "Background" description is for the purpose of generally presenting the context of the disclosure. Work of the inventors, to the extent it is described in this background section, as well as aspects of the description that may not otherwise qualify as prior art at the time of filing, are neither expressly or impliedly admitted as prior art against the present invention.

SUMMARY

The present disclosure relates to a system, apparatus and method for distinguishing elemental composition using 4D STEM.

According to an embodiment, a method for determining material properties of a sample using 4D STEM, includes: directing an electron beam from an electron source toward the sample; detecting electrons of the electron beam interacting with the sample via an electron detector including an array of detector elements; acquiring, from the electron detector, images of bright-field disks and surrounding dark-field diffraction based on the detected electrons; and determining an elemental composition of the sample based on the acquired images of the bright-field disks and the surrounding dark-field diffractions.

According to an embodiment, a method for compressive readout using an electron microscope, includes: generating a row address table including a first set of a truncated number of row addresses and a frame height, the truncated number of the row addresses being fewer than a possible maximum number of row addresses in the frame height; transmitting each row address of the truncated number of row addresses in the row address table to a controller, the controller configured to control an electron source to direct a beam of electrons onto a sample and read out charge from an electron detector including an array of detector elements, the electron detector configured to detect electrons of the electron beam; controlling the controller to read out along the transmitted row addresses; determining whether a last row address in the row address table has been read out; upon determining that the last row address in the row address table has not been read out, incrementing a pointer to a next row address in the row address table and controlling the controller to read out along the next row address; and repeating the controlling and determining until the last row address in the row address table has been scanned.

According to an embodiment, a system for determining material properties of a sample, includes: an electron detector including an array of detector elements configured to convert charges from impinging electrons to an electronic signal; and processing circuitry configured to read out the electronic signal from each detector element of the array of detector elements in a global shutter mode.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 17 is a hardware description of a computer for controlling the components of the system, according to an exemplary embodiment of the present disclosure.

DETAILED DESCRIPTION

Figure 1:
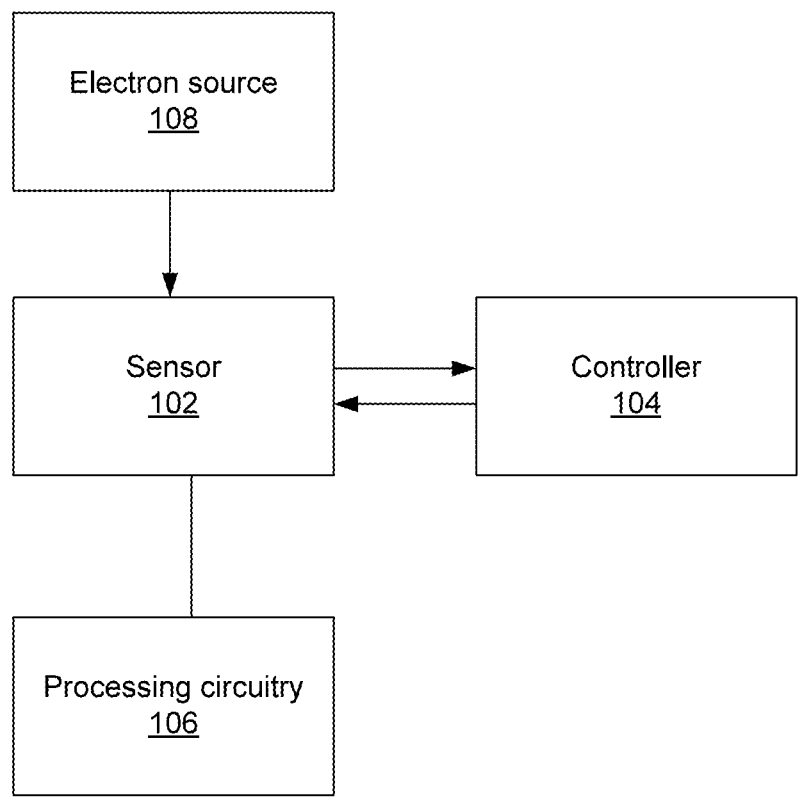
FIG. 1 is a schematic that shows a system for image-wise detection of charged particles according to one example.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

Cell biologists can introduce labels into living cells that migrate to specific regions or attach themselves to specific reactants, products, catalysts, etc. By using imaging techniques that allow the selective viewing of the labels, the scientists are able to glean information about the structure/function relationships of bodies in cells. Transmission electron microscopy (TEM) is the primary method for imaging biological cellular ultrastructure. However, unlike the lower-resolution technique of fluorescence light microscopy, it is not possible with conventional TEM to label and distinguish different kinds of cellular components in a single image.

To improve the throughput, efficiency, and resolution of multi-color EM, a multi-color EM technique based on scanning transmission electron microscopy (STEM) is described herein, which uses a high-speed pixelated detector to capture signals from a significant number of the primary electrons that interact with the specimen.

The present disclosure describes a system including a demonstrator camera and synchronized STEM scan generator installed on a STEM. In evaluating this system, a 4D STEM dataset of a cellular mitomatrix sample can be collected, wherein mitochondria can be labeled by cerium and including gold nanoparticles. Following correction of distortions in the diffraction patterns, as described in detail below, a metric can be developed to distinguish the cerium labels and gold nanoparticles while simultaneously generating bright-field and dark-field images of the specimen at significantly higher resolution than is possible through fluorescence light microscopy and with significantly better throughput and image quality than is possible with the previous EFTEM technique.

Achieving the necessary sensitivity for this technique can include that the pixelated detector deliver synchronized (global shutter) readout of a large number of pixels (at least 512×512 pixels) with single-electron sensitivity. Because biological cellular imaging requires a large specimen field-of-view, the pixelated detector must also be fast enough to scan a large area of the specimen before the instabilities in the specimen or the microscope introduce deleterious artifacts in the resulting data.

To push this technique to broad applicability in biological research, much faster detectors are needed so that large specimen areas may be imaged in a reasonable amount of time and with negligible specimen drift.

Generally, the present disclosure relates to a method for identifying elemental composition in an electron microscope. In an embodiment, the present disclosure is related to a method for identifying elements in specimens based on analyzing the details of convergent beam electron diffraction (CBED) patterns using a pixelated charged particle detector to record the details of the CBED pattern.

In an embodiment, the method described herein can be performed by a control device in accordance with a 4D STEM, or by the processing circuitry of a 4D STEM, directly.

To accomplish the above, modifications to the detector included modifying camera firmware so that it could either receive or generate timing pulses synchronized with frames. When the camera acts as master, it generates a pulse that is received by the scan generator and causes it to move to the next probe position. The camera has the flexibility so that the duration of the pulse, the precise timing of the pulse relative to the start of frame readout, etc., can be controlled. The camera can also operate in slave mode whereby it receives a pulse from the scan-generator that it uses to initiate the readout of a frame. Flexibility exists to adjust the exact time a readout occurs relative to receiving the pulse. Modifications of the detector further involved enabling global shutter readout. This capability was designed in to the sensor and firmware was developed and added to the camera to support the mode. The camera architecture is such that any number of new timing sequences can be developed and added to the camera as firmware updates. The camera supports switching between operation modes through a command interface.

Referring now to the drawings, wherein like reference numerals designate identical or corresponding parts throughout several views, the following description relates to a monolithic active pixel-array sensor (MAPS), a system including the MAPS, and a method for using the MAPS. The MAPS operates in synchronous readout mode. An integration time and a reset time of each pixel of the MAPS in an entire two dimensional (2D) array of pixels is simultaneous. As described herein, "array of pixels" may also be understood to mean an array of detector elements.

The MAPS described herein operates in a global shutter mode in contrast with conventional active pixel array direct bombardment charged particle detectors, which operate only in rolling-shutter (non-synchronous) readout mode, meaning that rows are reset and integrated sequentially one after another (asynchronously). The global shutter detector provides a means for an entire 2D image of the charge particles emanating from a single probe position to be captured without smearing artifacts.

Simultaneous integration of the entire image is also useful in charge particle imaging whenever images of fast-moving scenes are recorded such as in-situ electron microscopy (EM).

FIG. 1 is a schematic that shows a system 100 for image-wise detection of charged particles according to one example. The system 100 uses a global shutter (GS) readout mode. The system 100 includes a monolithic active pixel-array sensor (MAPS) 102, a scan controller 104, processing circuitry 106, and an electron source 108. The system 100 may also include a sample holder (not shown). Again, the array of pixels can also be understood to be an array of detector elements. For simplicity, "array of pixels" will be referenced herein. The MAPS 102 operates in synchronization with the scan controller 104 by sending or receiving a synchronization signal that controls the position of a probe beam of charged particles at the same frequency as the framerate of the MAPS 102. Thus, the scan controller 104 is synchronized to the framerate of the MAPS 102. A single distinct image of diffraction is recorded at each probe position, for example each scanning transmission electron microscopy (STEM) probe position. This global shuttering is useful for STEM and scanning electron microscopy (SEM), to prevent the frames from the detector from being a mixture of multiple beam positions.

In one implementation, the frame rate may be 255 fps, 484 fps, 875 fps, 1470 fps, or 2227 fps with a corresponding output size of 2048×2048, 1024×1024, 512×512, 256×256, 128×128, respectively.

In one implementation, the sensor is configured to process a 256×256 pixels global shutter readout at approximately 20,000 fps. At this speed, a 4096×4096 specimen area could be covered in less than 14 minutes.

The scan controller 104 is a flexible programmable scan controller that can trigger or be triggered by the MAPS 102.

A global shutter pixel design is used in the MAPS direct bombardment charged particle detector as described further below.

The MAPS resets and acquires data simultaneously. In one implementation, a hardware trigger signal is sent to the STEM scan generator, corresponding to the beginning of each frame's acquisition enabling precisely synchronized high-speed four-dimensional STEM (4D STEM) data acquisition.

In one implementation, the system 100 may be a transmission electron microscopy (TEM) system (e.g., 4D STEM or Ptychography) system. The combination of global shutter (GS) MAPS and a probe position controller achieves high speed scanning probe charged particle beam microscopy. The system 100 may include a MAPS in the energy range of 200 keV to ~1 MeV as described later herein.

In one implementation, the system 100 may include a MAPS for operation at energies below ~30 keV. For example, the system may be a SEM system (e.g., electron backscatter diffraction (EBSD), transmission Kikuchi diffraction (TKD) and ptychography).

In one implementation, the system may be an in-situ microscopy to record a movie without rolling shutter artifacts. The system 100 may be a TEM system operating at 120 keV and above using a MAPS.

Radiation sensitivity of MAPS detectors is of paramount importance, so simple pixel designs have been believed to be necessary to maximize sensor lifetime. Even with these simple pixel designs, MAPS detectors have finite lifetimes and require replacement after a period of use. In one implementation, the MAPS 102 has a 4-transistors (4T) pixel design that that enables global shutter without sacrificing sensor lifetime. In other implementations, the MAPS 102 may have more than 4-transistor pixels.

Since electrons penetrate a large volume on MAPS devices, other MAPS global shutter implementations can suffer from a "leaky shutter," meaning that charge from the next integration time can migrate from the charge collection/integration region (also called the pinned photodiode or PPD) to the charge storage area (also called the "sense node," "floating diffusion," or FD) resulting in additional noise and/or temporal blurring between multiple frames from the detector. The area of the charge storage area (i.e., the floating diffusion (FD)) relative to the charge collection/integration region (i.e., the pinned photodiode (PPD)) is minimized. Reducing the volume ratio of the FD and PPD areas is beneficial to minimize the leaky shutter problem. In one implementation, the MAPS 102 has a small FD which results in a reduction of the volume ratio. The small FD results in a low capacitance and therefore a high charge to voltage conversion ratio.

Because electrons penetrate metal layers, the small FD capacity is overcome by incorporating a second charge storage capacitor and implementing a HDR mode without sacrificing fill factor. In one implementation, the second charge storage capacitor is a metal-insulator-metal (MIM) capacitor. The MIM capacitor acts like a metal light shield for the FD to improve shutter efficiency in global shutter mode when photons are involved but does shield electrons.

The MAPS 102 has a large charge depletion region for the PPD and a small charge depletion region for the FD. Therefore, the effective volume of the FD is reduced and the volume of the PPD is maximized. The large charge depletion region for the PPD and the small charge depletion region for the FD are implemented by controlling the dopant levels in the area associated with the FD and PPD respectively as would be understood by one of ordinary skill in the art. For example, a highly doped p-well is used to reduce the volume of the FD. While those in the art may not attempt this because of a potential sacrifice to radiation hardness being too great, as recognized by the present inventors, the large charge depletion region for the PPD and the small charge depletion region for the FD have minimal effect on the radiation hardness, and experimental testing has shown that radiation hardness does not suffer with this design.

Electrons in an energy range of 100 keV and greater entering from the front pass entirely through the epitaxial silicon area region depositing charge along their entire trajectory. The electrons in the energy range of 100 keV and greater have a behavior like red photons more than blue photons in terms of where charge is generated, as recognized by the inventors. Electrons having an energy of less than 30 keV and entering from the back side behave more like blue photons. As the energy of the electrons decrease, the energy is deposited closer to the back surface of the MAPS. In both these cases, minimizing the volume of the FD improves shutter efficiency by reducing the likelihood that charge deposited by electrons incident on the sensor will migrate to the FD instead of the PPD.

Figure 2:
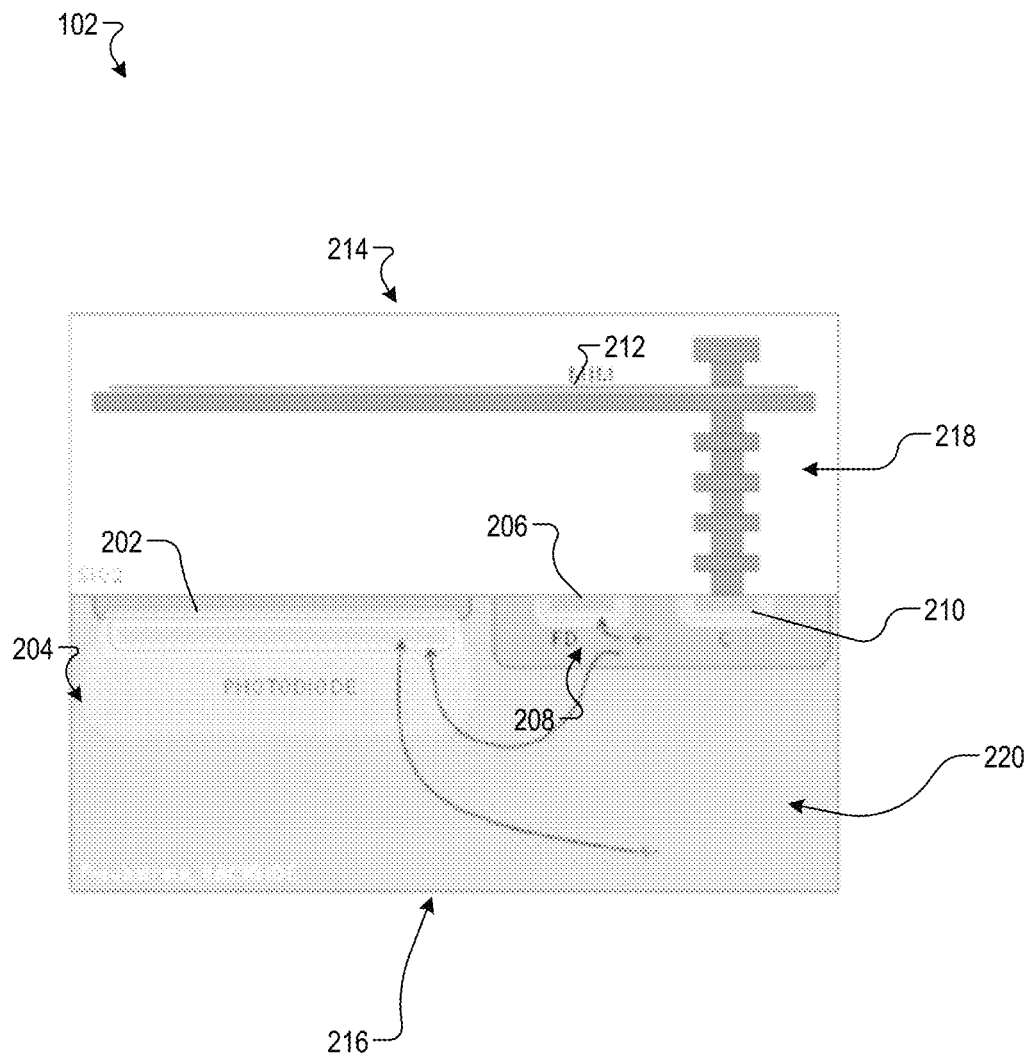
FIG. 2 is a schematic that shows a cross section of a monolithic active pixel-array sensor (MAPS) according to one example.

FIG. 2 is a schematic that shows a cross section of the MAPS 102 according to one example. The PPD 202 has a large area and volume and is shown collecting electrons from a large area indicated by 204 in FIG. 2, including areas quite close to the FD 206. The FD 206 has a small depletion region and only collects electrons created in a volume very close to it (indicated by 208 in FIG. 2). A contact 210 to the MIM 212 is minimized to minimize the contribution to the leaky shutter problem.

A front side of the MAPS 102 is indicated by 214 in FIG. 2. A back side of the MAPS 102 is indicated by 216 in FIG. 2. Region 218 includes many layers that are not shown that are involved in creating the transistors and interconnects that make up the pixel electronics. Electrons that are absorbed in region 218 do not create conduction band electrons (photo-charge) that contribute signal. The epitaxial silicon area 220 (also called epi) generates and collects charge. Below the epitaxial silicon area 220 is a substrate (not shown).

Microscope electrons can enter the device from either the front side 214 or the back side 216 as described later herein. The electrons interact with the silicon in the epitaxial silicon area 220 and generate conduction band electrons. Unlike photons, the microscope electrons carry much more energy and generate many conduction band electrons for each incident electron. The number of conduction band electrons generated depends on many factors including the incident energy of the system (e.g., microscope electron).

In one implementation, the storage area is restricted to less than, for example, 5%, or 2.5%, or preferably, 1.25% of the charge integration area. The volume ratio is greater than approximately, for example, ¹⁄₂₀₀, or ¹⁄₄₀₀, or preferably, ¹⁄₈₀₀. If shutter efficiency is dictated entirely by volume ratio, the sensor has shutter efficiency of 99.875% for ¹⁄₈₀₀ the volume ratio.

In one implementation, the charge storage area is restricted to less than 0.8% of the charge integration area. The volume ratio is about ¹⁄₁₂₀₀. If shutter efficiency is dictated entirely by volume ratio, the sensor has shutter efficiency of 99.92%.

For electrons, shutter efficiency scales with volume ratio. The ratio is maximized by using larger pixels. Shutter efficiency can be estimated from the volume ratio and additional information concerning where in the epi region photo-charge is likely to be generated. Estimated values can be compared with measurements to test the validity of assumptions.

Figure 3:
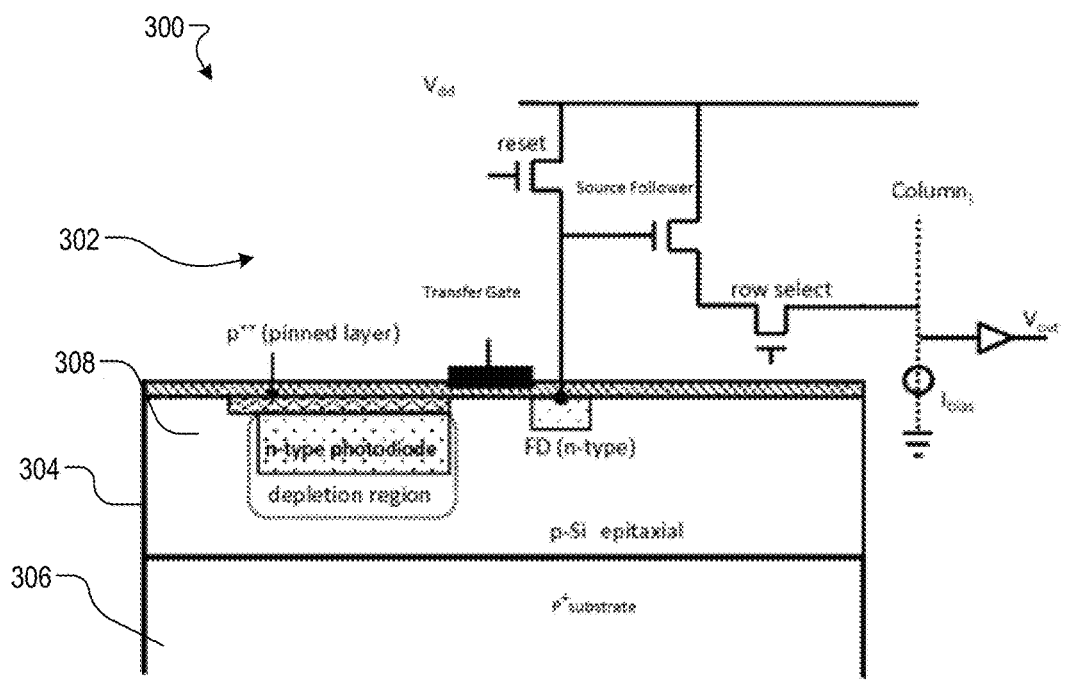
FIG. 3 is a schematic that shows a cross section of a single pixel of a 4-transistor (4-T) sensor for front side illumination (FSI) according to one example.

FIG. 3 is a schematic that shows a cross section of a single pixel 300 of a 4T sensor for front side illumination (FSI) according to one example. Electrons having energy greater than 30 keV and preferably greater than 100 keV, enter from the front side of the pixel 300, pass through the circuitry layer 302, and deposit charge throughout the epi layer 304 and the substrate 306. Charge generated in the substrate 306 undergoes recombination due to the high doping there and does not contribute to the signal that is measured. Charge generated in the epi 304 are collected predominantly by the PPD 308.

For higher energy electrons (typically >100 keV to over 1 MeV), a good shutter efficiency is achieved by minimizing the FD to PPD volume ratio as described previously herein and taking advantage of the fact that the microscope electrons generate photo-charge throughout the full thickness of the epi layer 304 as recognized by the inventors. The epi layer 304 has a thickness in the range of from 5 microns to 18 microns. Further, the substrate is thinned from the back side to leave a layer that may range from a few microns to a few tens of microns. This prevents the electrons from backscattering in the substrate and re-entering the epi layer to deposit more charge in areas away from where they originally entered and therefore contributing to noise.

Figure 4:
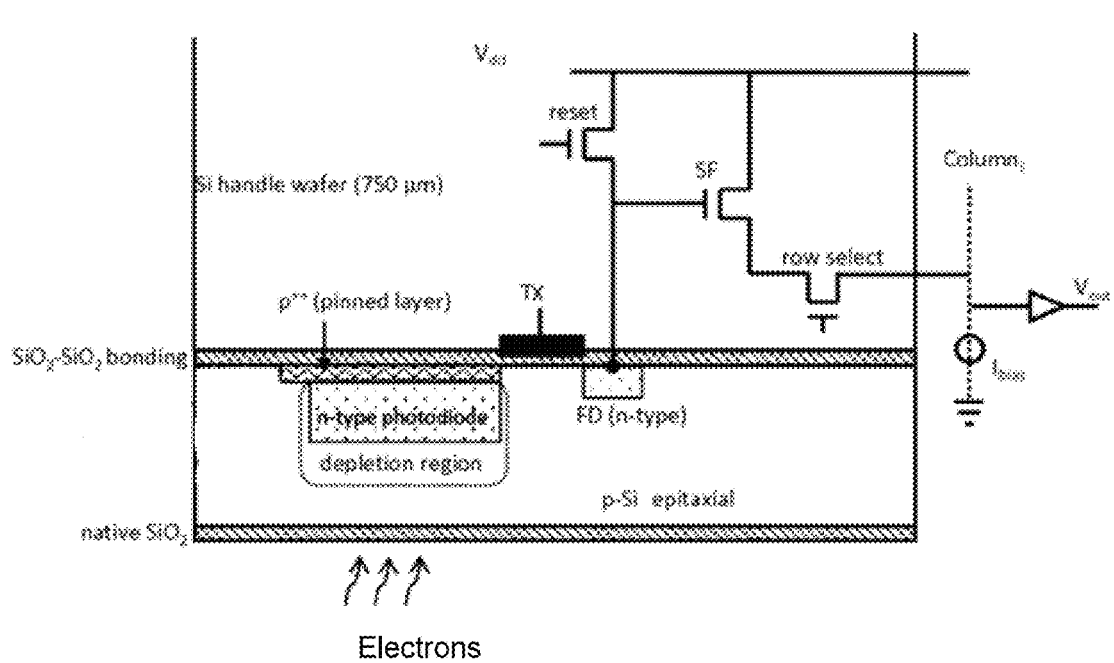
FIG. 4 is a schematic that shows a cross section of a single pixel for back side illumination (BSI) according to one example.

FIG. 4 is a schematic that shows a cross section of a single pixel 400 for back side illumination (BSI) according to one example. For electrons having an energy less than ~30 keV, better sensitivity is achieved by introducing signal from the back side. The manufacturing method of the pixel 400 includes bonding a conventional wafer to a handle wafer and then removing the substrate from the sensor thereby exposing the surface of the epi.

The absorption length for electrons in the <30 keV range in silicon falls from on the order of 5 microns to less than 1 micron for 1 keV electrons as recognized by the current inventors. The pixel 400 has a 5~6 micron epi layer and a shallow FD. The high shutter efficiency with BSI is achieved because the generated charge carriers diffuse to the PPD rather than the FD.

In one implementation, the BSI MAPS is included in a TEM system. The TEM operates in a range of 60 to 120 keV with BSI detection.

To illustrate the capabilities of the MAPS 102 described herein, exemplary results are presented.

In order to evaluate the synchronization between the frame rate of the sensor and the STEM probe movement controlled by the scan controller 104, the scan controller 104 instructed the STEM probe to alternate between an empty specimen area and a copper grid bar. A trigger delay of the sensor (i.e., camera) was adjusted until the intensity difference between the bright-filed disk in bright frames (i.e., when the STEM probe is over an empty specimen area) and dark frames (i.e., when the STEM probe was over the copper grid bar) is maximized. The process is repeated in a rolling shutter readout mode and in a global shutter readout mode.

Figure 5A:
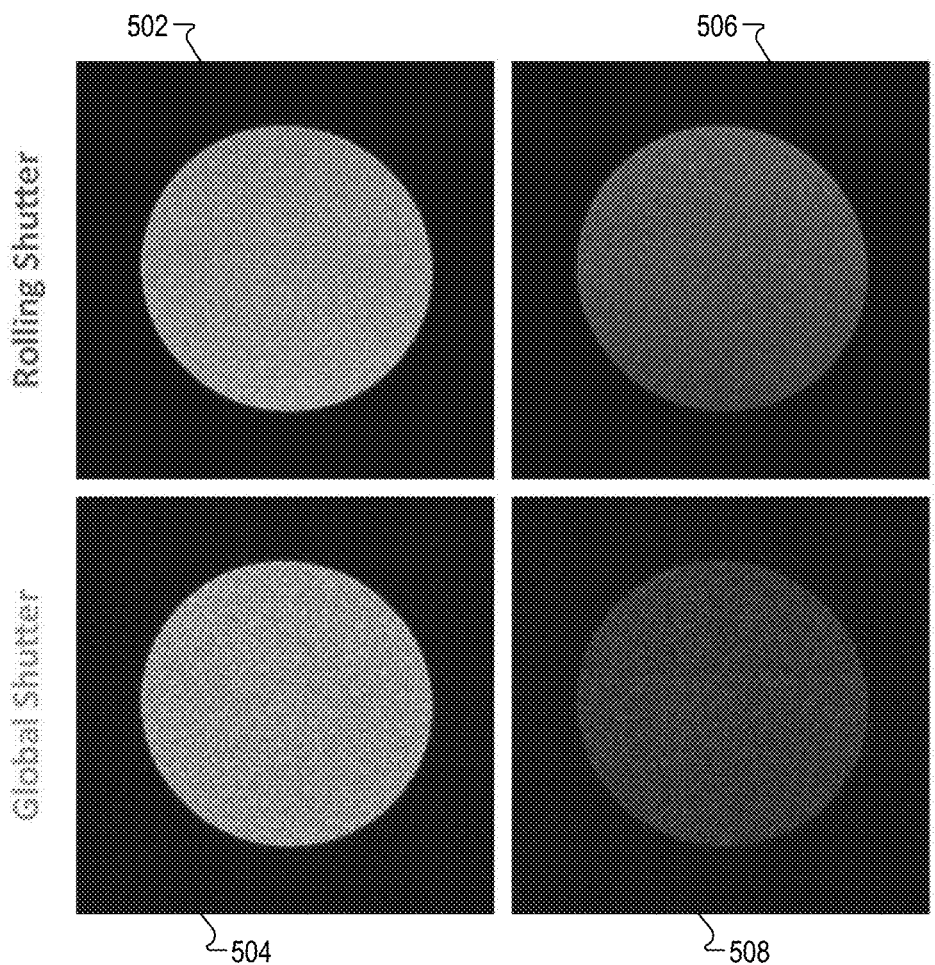
FIG. 5A is a schematic that shows exemplary images captured by the system according to one example.

FIG. 5A is a schematic that shows exemplary images captured by the system described herein. A TEM beam position alternated between an empty area of the specimen and a copper grid bar in synchronization with the frame rate of the sensor. Image 502 is an image of the bright-field disk when the beam was over an empty specimen area using a rolling shutter technique. Image 504 is an image of the bright-field disk when the beam was over an empty specimen area using the global shutter technique described herein. Image 506 is an image of the bright-field disk when the beam was over the copper grid bar using a rolling shutter technique. Image 508 is an image of the bright-field disk when the beam was over the copper grid bar using the global shutter technique described herein.

Figure 5B:
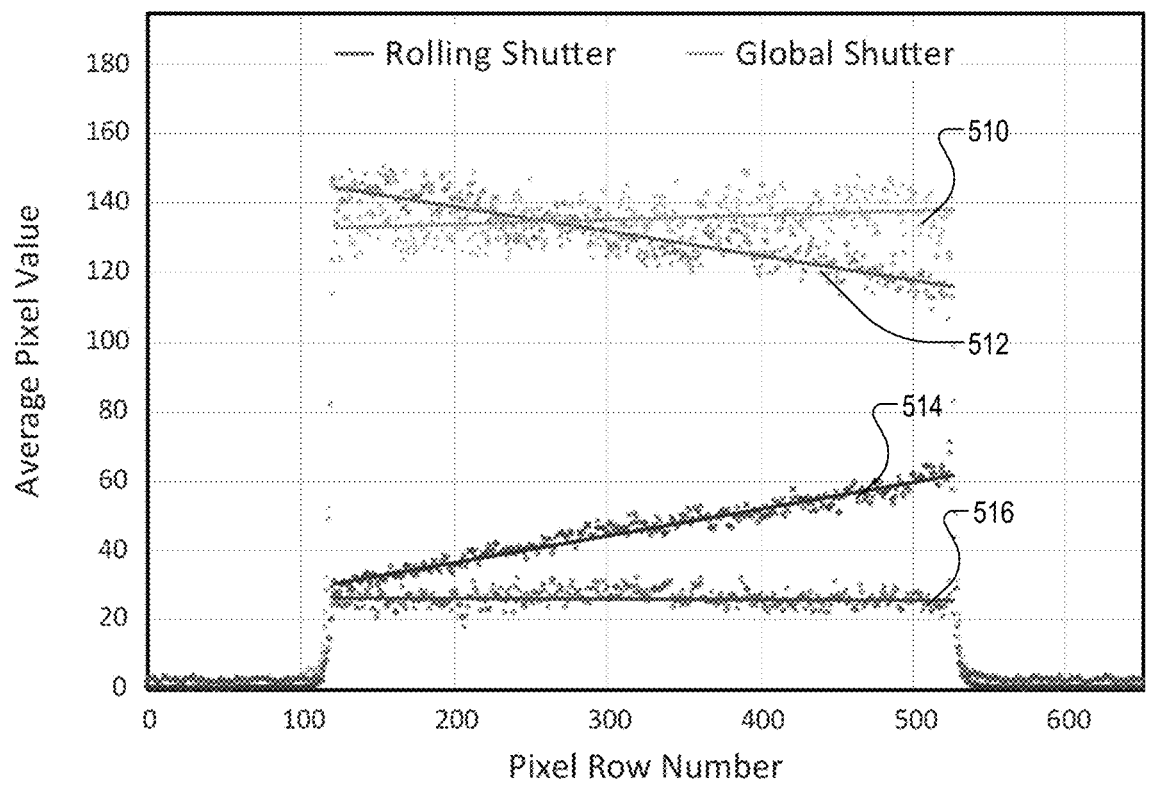
FIG. 5B is a schematic that shows pixel intensity profiles across a 36-pixels wide vertical stripe in the center of each bright-field disk of the images of FIG. 5A.

FIG. 5B is a schematic that shows the pixel intensity profiles across a 36-pixel wide vertical stripe in the center of each bright-field disk of the images shown in FIG. 5A. The line of best fit over the pixels is shown across the actual data points. As seen in the images the rolling shutter modes offer from a reduced intensity difference between bright and dark frames and the intensity gradient visible across the bright-field disk. These artifacts are visible in a rolling shutter readout mode, regardless of the camera's trigger delay setting, indicating that rolling shutter readout always records a mixture of two STEM probe positions.

Trace 510 corresponds to the intensity profile of image 504. Trace 512 corresponds to the intensity profile of image 502. Trace 514 corresponds to the intensity profile of image 506. Trace 516 corresponds to the intensity profile of the image 508.

As shown in trace 516 in FIG. 5B in global shutter readout mode there is a negligible intensity between the bright and dark frames indicating that frame readout from the detector is successfully synchronized with the movement of the STEM probe. Each frame corresponds to exactly one STEM probe position.

Figure 6:
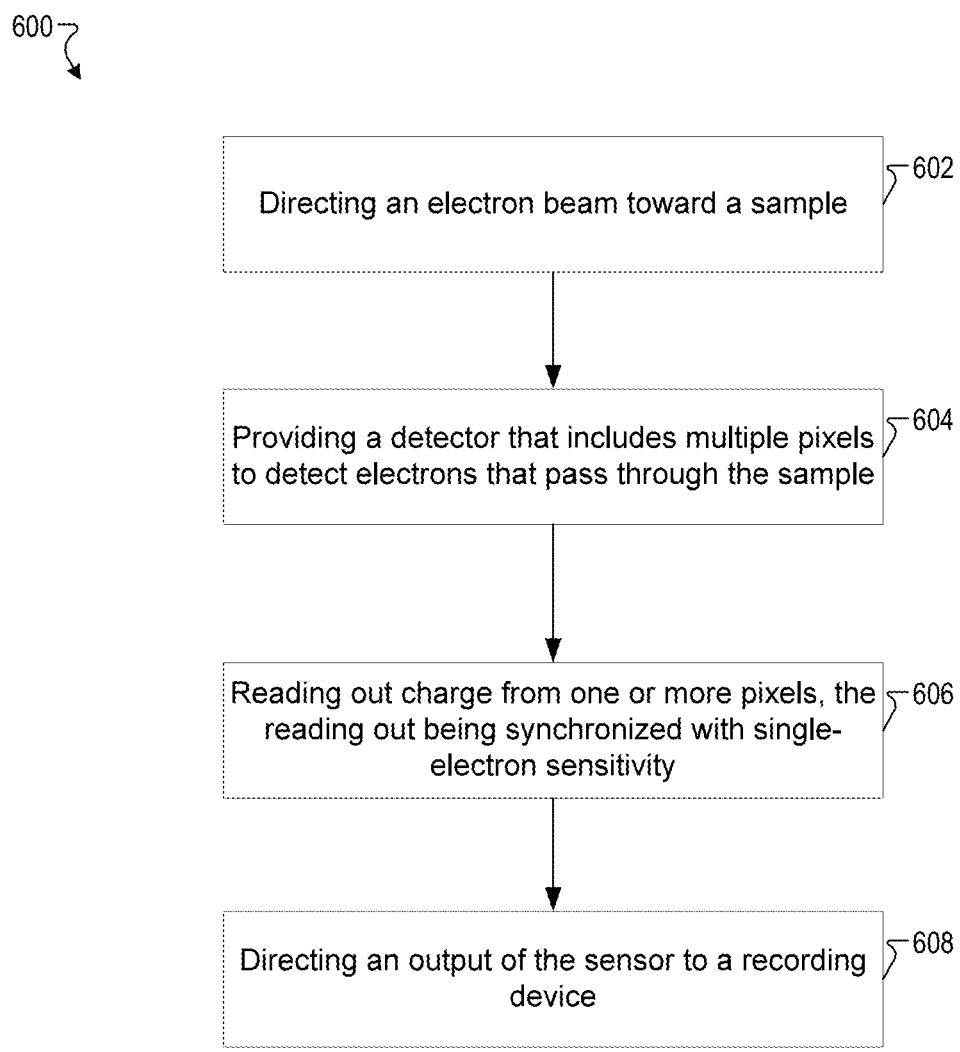
FIG. 6 is a flow chart for a method for imaging a sample according to one example.

FIG. 6 is a flow chart for a method for imaging a sample according to one example. At step 602, an electron beam is directed toward the sample.

At step 604, a sensor is provided. The sensor may be any pixelated detector, but preferably is a direct electron detector, and even more preferably, is a global shutter direct electron detector. The global shutter direct electron detector may be the back side illuminated MAPS 102 or the front side illuminated MAPS 102 as described previously herein. The sensor is positioned below the sample. The detector includes multiple pixels configured to detect electrons that pass through the sample. In one embodiment, the sensor includes 4096×4096 pixels. In another embodiment, the sensor includes 1024×1024.

At step 606, data are read out from the detector in a global shutter mode so that frames from the MAPS are synchronized with the moving probe, for example the STEM or SEM probe.

At step 608, the output from the sensor is directed to a recording device and/or a display device. For example, a user interface can display the image to a user and can receive instructions from the user.

Figure 8A:
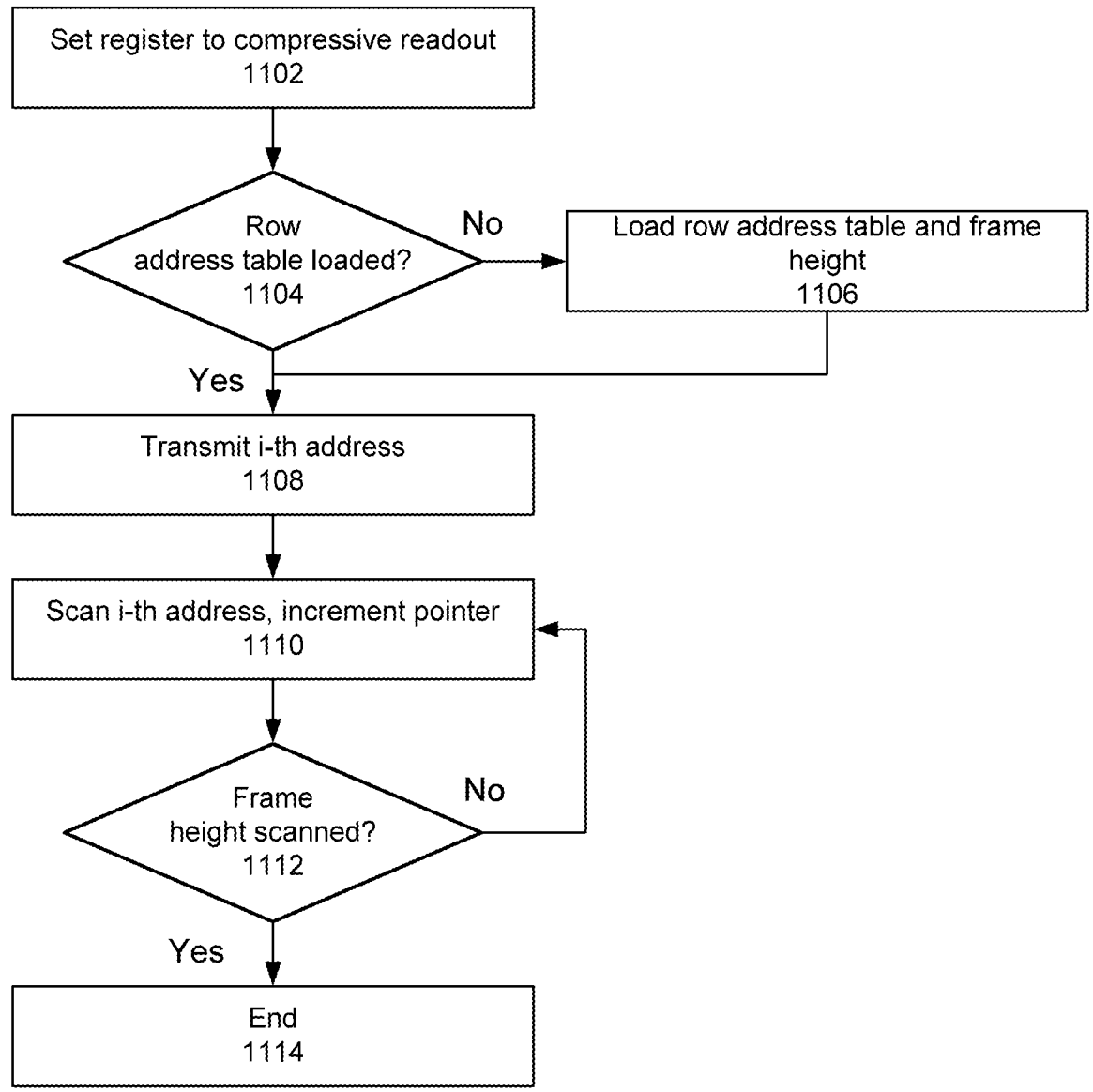
FIG. 8A is a flow chart for a method for compressive readout mode of a single frame, according to one example.
Figure 8B:
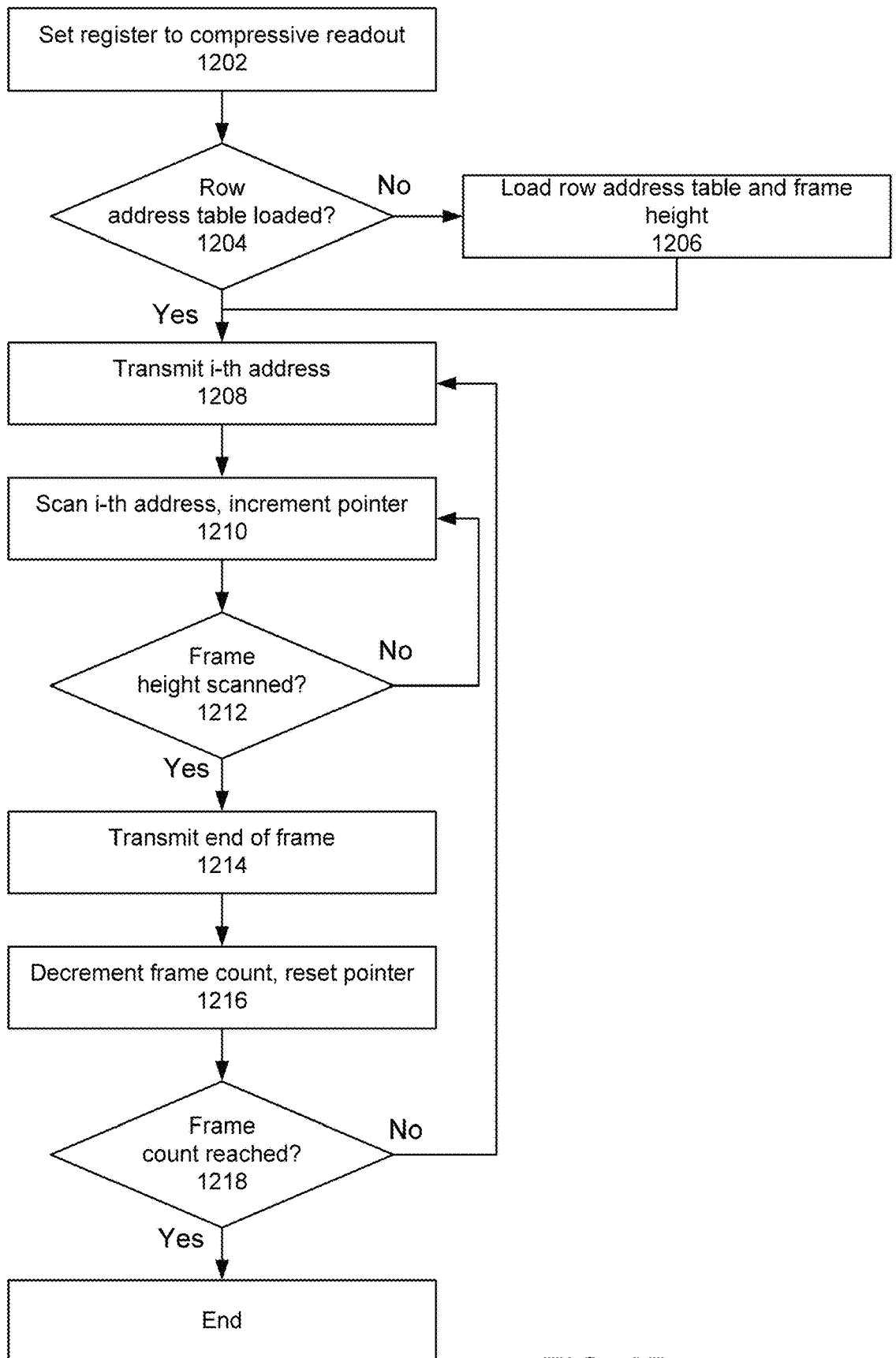
FIG. 8B is a flow chart for a method for compressive readout mode of multiple frames with the same rows, according to one example.
Figure 8C:
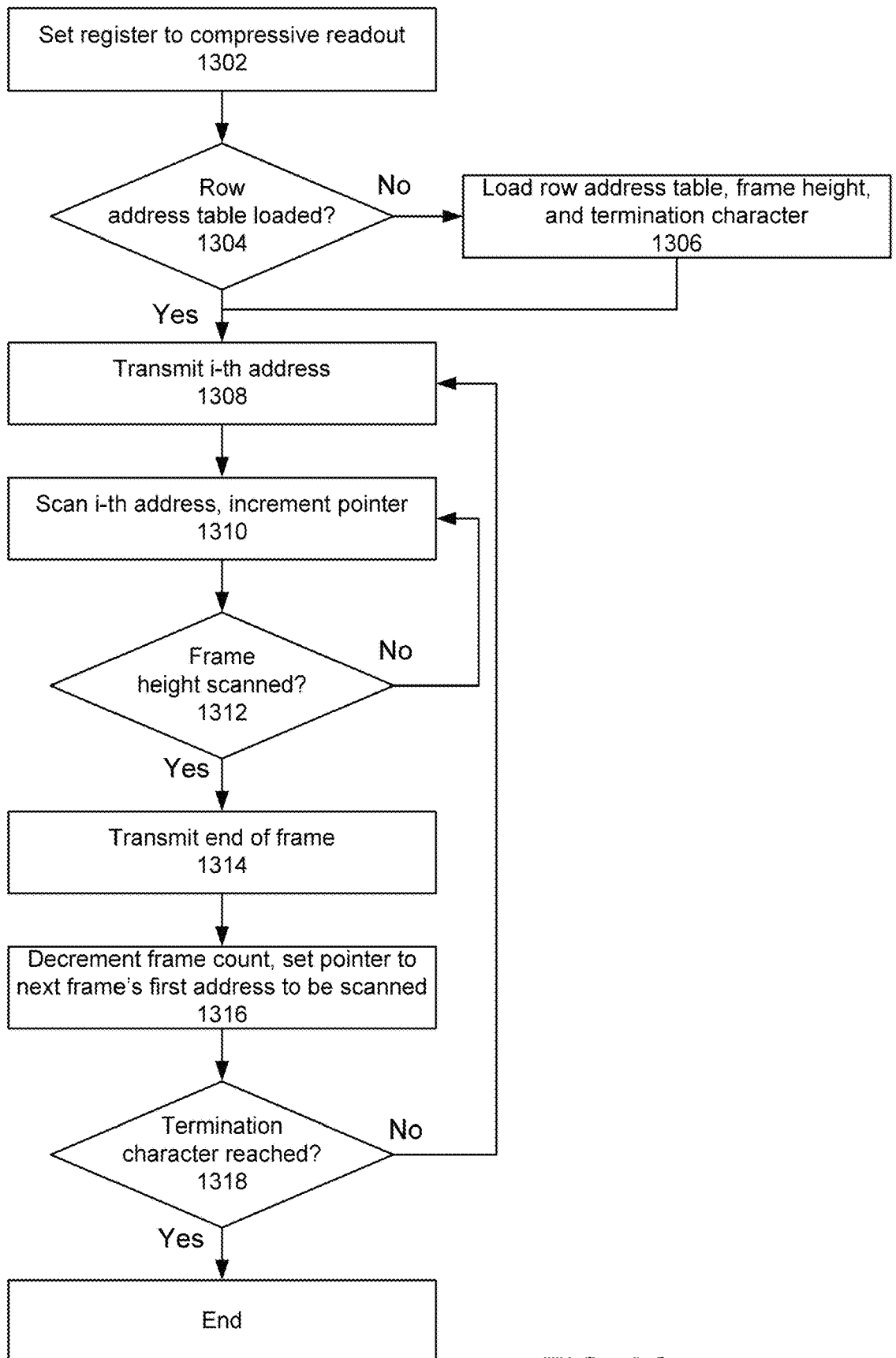
FIG. 8C is a flow chart for a method for compressive readout mode of multiple frames with unique rows, according to one example.

According to an embodiment, FIGS. 8A-8C are related to a method of customizing readout of pixel array rows/columns and compressed sensing in the MAPS 102. Advantages include increased sensitivity, speed, resolution, and field-of-view.

In complementary metal-oxide-semiconductor (CMOS) detectors used in EM (e.g. scintillator-coupled, direct detection, etc.), the frame rate of the camera may be increased by reducing the field-of-view on the camera in a first dimension, for example a Y dimension. An image may include a plurality of rows of pixels, and the rows may be indexed along the Y dimension, for example with a numerical address. In some scanning methods, a frame may be produced by reading all or some of the rows in the image. The frame may be produced by the camera performing a sequential row readout. Since the row readout is sequential, regardless of whether the MAPS 102 is operating in rolling shutter or global shutter readout mode, reducing the number of rows being read out reduces the amount of time required for readout of each frame and thus increases the maximum frame rate of the camera. Since these detectors generally require readout of contiguous rows, reducing the number of rows being read out from the camera can also reduce the field-of-view of the camera.

Described herein is a method to mitigate said problem by reading randomly selected rows across the entire field-of-view and using in-painting algorithms or other methods to recover or account for the missing information, thereby providing high frame rate and large field-of-view. The method may also rapidly change the selected rows or kernel rows so that information obtained from the reconstruction of an image can be used to modify the selection of rows used in subsequent frame acquisitions in response to determining the targeted scan area. This aspect of the method may mitigate the problem of potentially making a sub-optimal selection of rows for the subsampling based on the yet unknown content of the image.

The MAPS 102 may be arranged in a plurality of rows and columns. Multiple adjacent rows may be grouped together into "kernel rows" and multiple adjacent columns may be grouped together into "kernel columns." Instead of reading all rows/columns from a sensor or a subarray of contiguously arranged rows/columns from a detector, a number of arbitrary, randomly selected, noncontiguous rows/column may be readout from the detector. Thus, some rows/columns may be ignored. The ignored rows/columns may be either readout with a constant pixel value or may be omitted from the image output from the detector. In some cases, missing image information may be restored after image capture using an image in-painting method. This method may allow for increased frame rate without reducing field-of-view. This strategy may also use kernel rows or kernel columns instead of individual rows or columns. This may be useful to enable compressive sensing applications for charged particle or photon imaging.

The disclosed method may provide higher frame rate from an imaging system than what it is natively capable by sub-sampling or sparsely sampling information and then using algorithms to in-paint the missing information. The disclosed method may also be utilized to reduce the amount of data that needs to be transmitted while still retaining sufficient information content for the intended purpose. This may be of value where, for example, transmission bandwidth is limited, data storage space is limited, or both. The technique is applicable to the EM field when dynamic processes are being studied (high frame rates are desired). Similarly, the technique is potentially advantageous in any imaging field where high frame rate or data size reduction is of interest.

In some sampling methods, the subsampling is periodic and thus is not suitable for in-painting (just interpolation). Moreover, periodic subsampling may not allow for rapid changes in the subsampling. That is to say, without stopping the acquisition, writing new values to the control registers, and restarting acquisition.

In an embodiment, a scan controller method of subsampling is complementary to an image sensor subsampling. A combination of both methods is possible and results in even further data reductions and frame rate increases.

Figure 7A:
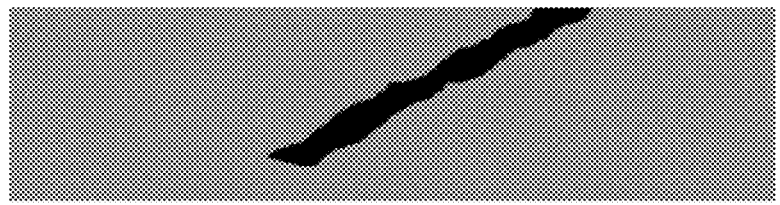
FIG. 7A shows an image of a TEM beam stop acquired with 25% subsampling, according to one example.

FIG. 7A shows an image of a TEM beam stop acquired with 25% subsampling on the detector, according to one example. In an embodiment, the image may be acquired where readout from the camera was a compressed 4096×1024 image resulting in a 4× frame rate increase. To address the need for higher frame rate imaging, a new undersampled and compressed readout mode called Arbitrary Kernel Row Addressing (AKRA) or Arbitrary Row Addressing (ARA) may be utilized. For example, the image of the TEM beam stop may be acquired in the ARKA readout mode. In the AKRA readout mode, a user may specify any arbitrary combination of kernel rows from a detector to read, while all other kernel rows are skipped. For example, the kernel rows may include eight unbinned pixels in height. In the ARA readout mode, individual rows may be specified. By reading out fewer rows, the detector frame rate may be significantly increased, yet since the kernel rows are distributed across the entire MAPS 102, the field-of-view on the specimen may not be reduced.

Figure 7B:
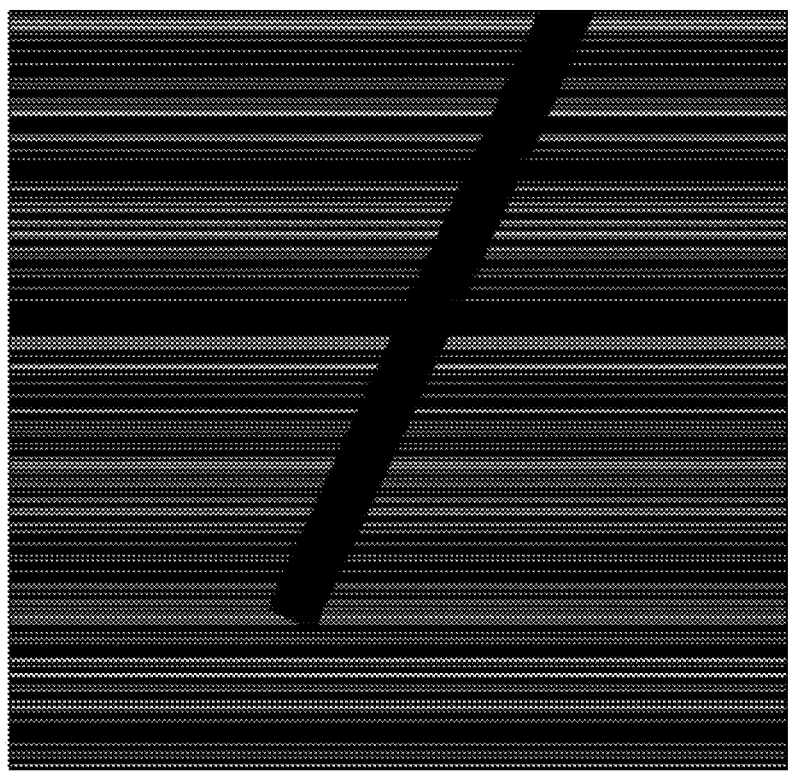
FIG. 7B shows an image of the TEM beam stop from FIG. 7A including the missing rows and the full 4096×4096 field-of-view, according to one example.

FIG. 7B shows an image of the TEM beam stop from FIG. 7A including the missing rows and the full 4096×4096 field-of-view, according to one example. Again, the FIG. 7A image may be acquired in AKRA mode with 25% subsampling, and FIG. 7B illustrates the expansion of the sub-sampled image. Depending on the application, "missing" pixels from AKRA (or ARA) images may be reconstructed using an in-painting algorithm or measurements can be made directly from the actual rows that are readout as long as the coordinates of each image are properly accounted for. Since the selection of kernel rows was pseudo-random, the edges of the beam stop in FIG. 7A appear jagged rather than a uniform stair-step, and the light bands in FIG. 7B show the random distribution. That is to say, random sampling is optimal for effective in-painting.

In an embodiment, the MAPS 102 design features that may allow this mode of operation may include: (1) an address decoder for rows (or kernel rows) that allows selection of the addressed row for readout, (2) said address decoder capable of receiving any address (rows can be addressed in any order and any number of rows skipped or read in groups, etc.), and (3) a high-speed interface that allows row addresses to be sent to the MAPS 102 in a pipelined fashion so that the next row to be addressed can be specified while a current row is being readout.

In an embodiment, the camera design features that may allow a sequentially scanned, full sampling readout mode of operation include: (1) a table that includes addresses of each row (or kernel row) in sequential order used for readout, (2) a termination character at the end of the table, (3) a pointer that is advanced through the table, and (4) a register that contains the total number of rows to be readout.

In an embodiment, the full sampling readout mode of a single frame includes using the total number of rows to be readout (the frame height) to increment a pointer in a table of row addresses. For each row, the pointer is incremented, and the new row address is transmitted to the camera. The procedure continues until all of the rows are read. If a termination character is reached before the total row count is exceeded, the pointer is reset to a first entry in the row address table and the process continues until the total number of rows is reached. This feature is especially advantageous for facilitating compressive readout as explained herein.

In an embodiment, the camera design features that allow random rows mode (compressed mode) of operation (similar to above) include: (1) a programmable bit (register) that signals full sampling or compressive readout mode, (2) the table that includes addresses of each row (or kernel row) that the user specifies for readout, (3) a method for loading values into the table (a set of registers—table position and row address), (4) a method for reading values included in the table, (5) the termination character at the end of the table, (6) the pointer that is advanced through the table, and (7) the register that includes the total number of rows to be readout. For example, the row addresses can be any, all, or a minimum of 2 rows, specified in any order. The table length may be anything and may be limited only by the amount of memory available. For example, 64,000 addresses may be enabled. This is a different table from the one used for sequential readout described above for fast switching.

FIG. 8A is a flow chart for a method for compressive readout mode of a single frame, according to one example. At step 1102, the register is set to perform the compressive readout mode. At step 1104, if the row address table is not loaded, the method proceeds to step 1106. For example, the row address table may include arbitrary row addresses and the frame height. In step 1106, the row address table is loaded. If the arbitrary row address table is loaded, the method proceeds to step 1108. In step 1108, the address of the row to be scanned is transmitted to the camera or electron source. In step 1110, the camera scans the transmitted row and the pointer is incremented to the next row to be scanned in the row address table. In step 1112, if the frame height has not been entirely scanned, the method proceeds back to step 1110 and the next row is scanned. If the frame height has been entirely scanned, the method proceeds to step 1114. In step 1114, the end of the frame is reached and the scanning ends.

Table 1 shows an example of arbitrary row addresses for the compressive readout mode method described in FIG. 8A.

TABLE 1 single frame arbitrary row scanning.

| ADDRESS | VALUE (ROW ADDRESS) |
|---|---|
| 0 | 7 |
| 1 | 13 |
| 2 | 24 |
| ... | |
| (Frame height − 1) | 4067 |

FIG. 8B is a flow chart for a method for compressive readout mode of multiple frames with the same rows, according to one example. At step 1202, the register is set to perform the compressive readout mode. At step 1204, if the row address table is not loaded, the method proceeds to step 1206. For example, the row address table may include arbitrary row addresses and a frame count, wherein the same row addresses may be scanned over multiple frames until the frame count is reached. In step 1206, the row address table is loaded. If the arbitrary row address table is loaded, the method proceeds to step 1208. In step 1208, the address of the row to be scanned is transmitted to the camera or electron source. In step 1210, the camera scans the transmitted row and the pointer is incremented to the next row to be scanned in the row address table. In step 1212, if the frame height has not been entirely scanned, the method proceeds back to step 1210 and the next row is scanned. If the frame height has been entirely scanned, the method proceeds to step 1214. In step 1214, the end of the frame is reached and the method proceeds to step 1216. In step 1216, the frame count is decremented and the pointer is reset to the first address (i.e. the first row to be scanned). In step S1218, if the frame count has not been reached, the method proceeds to step 1208 and another compressive scan is performed. If the frame count has been reached, the scan ends.

Table 2 shows an example of arbitrary row addresses for the compressive readout mode method described in FIG. 8B.

TABLE 2

Multi-frame arbitrary row scanning.

| ADDRESS | VALUE (ROW ADDRESS) |
|---|---|
| 0 | 22 |
| 1 | 167 |
| 2 | 943 |
| ... | |
| (Frame height − 1) | 3894 |

FIG. 8C is a flow chart for a method for compressive readout mode of multiple frames with unique rows, according to one example. At step 1302, the register is set to perform the compressive readout mode. At step 1304, if the row address table is not loaded, the method proceeds to step 1306. For example, the row address table may include arbitrary row addresses and a termination character, wherein row addresses may be scanned over multiple frames until the frame count is reached and the row addresses for each frame are unique. The termination character may be utilized to signal an end of the scan method, wherein new frames are scanned until the termination character is reached. In step 1306, the row address table is loaded. If the arbitrary row address table is loaded, the method proceeds to step 1308. In step 1308, the address of the row to be scanned is transmitted to the camera or scan generator. In step 1310, the camera scans the transmitted row and the pointer is incremented to the next row to be scanned in the row address table. In step 1312, if the frame height has not been entirely scanned, the method proceeds back to step 1310 and the next row is scanned. If the frame height has been entirely scanned, the method proceeds to step 1314. In step 1314, the end of the frame is reached and the method proceeds to step 1316. In step 1316, the pointer is set to the first address for the next frame (i.e. the first row to be scanned). Note that the first address, as well as all the addresses for the next frame, may be different from the addresses of the previously scanned frame. Compared to the method of FIG. 8B, this method does not use the same table for each scan. Rather, a large table can be generated for all the frames to be scanned with each frame having unique addresses, or a new table can be generated after each frame is scanned. In step S1318, if the termination character in the row address table has not been reached, the method proceeds to step 1308 and another compressive scan is performed. If the termination character has been reached, the scan ends.

Table 3 shows an example of arbitrary row addresses for the compressive readout mode method described in FIG. 8C.

TABLE 3

Multi-frame arbitrary row scanning with unique frame addresses.

| ADDRESS | VALUE (ROW ADDRESS) |
|---|---|
| 0 | 22 |
| 1 | 167 |
| 2 | 943 |
| ... | ... |
| (Frame height − 1) | 3894 |
| (Frame height) | 17 |
| (Frame height + 1) | 34 |
| ... | ... |
| (Frame height * 2) | 9 |
| (Frame height * 2) + 1 | 64 |
| (Frame height * 2) + 2 | 237 |
| ... | ... |
| (Frame height * 3) | 54 |
| (Frame height * 3) + 1 | 150 |
| (Frame height * 3) + 2 | 420 |
| ... | ... |
| | Termination character |

STEM has been used in biological specimen imaging and has been shown to produce enough contrast at low electron energy to enable imaging without contrast agents (stains). STEM has also been used with cryogenically cooled specimens.

Spectroscopic methods have also been developed for STEM including electron energy loss spectroscopy (EELS) and energy-dispersive X-ray spectroscopy (EDX, EDXS, EDS, XEDS). These methods allow identification of elements present in the specimen. EELS and the related non-STEM energy filtered TEM (EFTEM) imaging, also called EFTEM, use a very small fraction of the incident electron beam and are therefore very inefficient. Likewise, EDX is very inefficient. A consequence of this inefficiency is that specimens must be exposed to high levels of electron illumination to obtain useful results. A second consequence is that these measurements can be very time consuming and specimen or microscope stability may not be enough to allow collection of data from large areas.

It is an object of the present invention to provide an efficient means for collecting elemental information from a single STEM scan. It is a further object of the present invention to reduce the beam dose a specimen receives to produce an elemental map. It is a further object of the present invention to reduce the time required to produce an elemental map from a specimen, particularly from a large area of a beam-damage sensitive biological or other specimen.

In conventional STEM, a dedicated bright-field (BF) detector, annular dark field (ADF) detector, and high-angle annular dark-field (HAADF) detectors are used for data acquisition, typically yielding three data points per scan coordinate on the specimen. In 4D STEM, a pixelated detector replaces all of the conventional STEM detectors (except perhaps the HAADF detector, in some cases). The pixelated detector then captures a two-dimensional image for each scan position on the specimen. In the present disclosure, a large area (1024×1024 pixels) of a camera was used, yielding over one million (1,048,576) pixels per scan coordinate on the specimen. This is more than five orders of magnitude more data than conventional STEM.

Figure 9A:
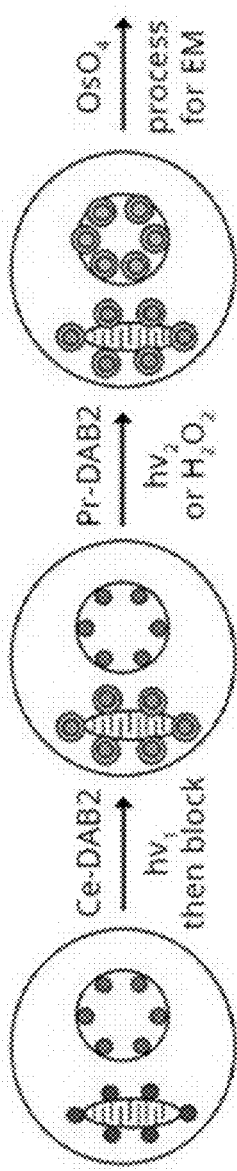
FIG. 9A is a schematic of specimen preparation for labeling mitochondria (left) and nuclear membranes (right), according to one example.
Figure 9B:
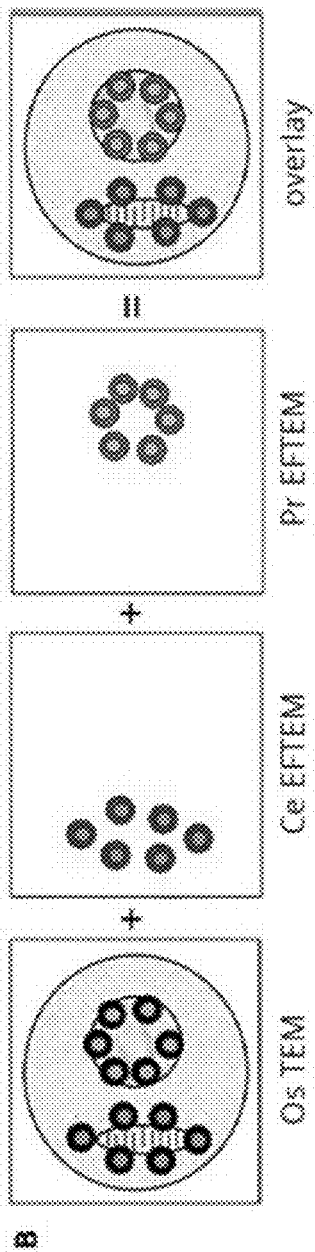
FIG. 9B is a schematic of a multi-color electron microscopy (EM) using EFTEM method, according to one example.
Figure 9C:
FIG. 9C is a schematic of a single-shot multi-color EM using 4D-scanning transmission electron microscopy (4D STEM), according to one example.

With reference now to FIG. 9A through FIG. 9C, the present disclosure includes preparation methods for a multi-color EM technique.

FIG. 9A reflects specimen preparation for labeling mitochondria (left) and nuclear membranes (right), FIG. 9B reflects a multi-color EM approach according to EFTEM, and FIG. 9C reflects the single-shot multi-color EM using 4D STEM, according to one example. First, a standard calibration grid with graphitized carbon and gold islands can be used as an initial test specimen for 4D STEM. Second, a cellular mitomatrix sample, labeled with Ce-DAB, Ruthenium tetroxide, and 30 nm gold particles, can be used to develop and evaluate the single-shot multi-color EM technique. Biological specimen preparation can be performed as shown.

A high-speed pixelated detector can be used to capture a series of images during a scanning transmission electron microscopy (STEM) acquisition, with a one-to-one correspondence between images and electron probe positions on the specimen.

Figure 10:
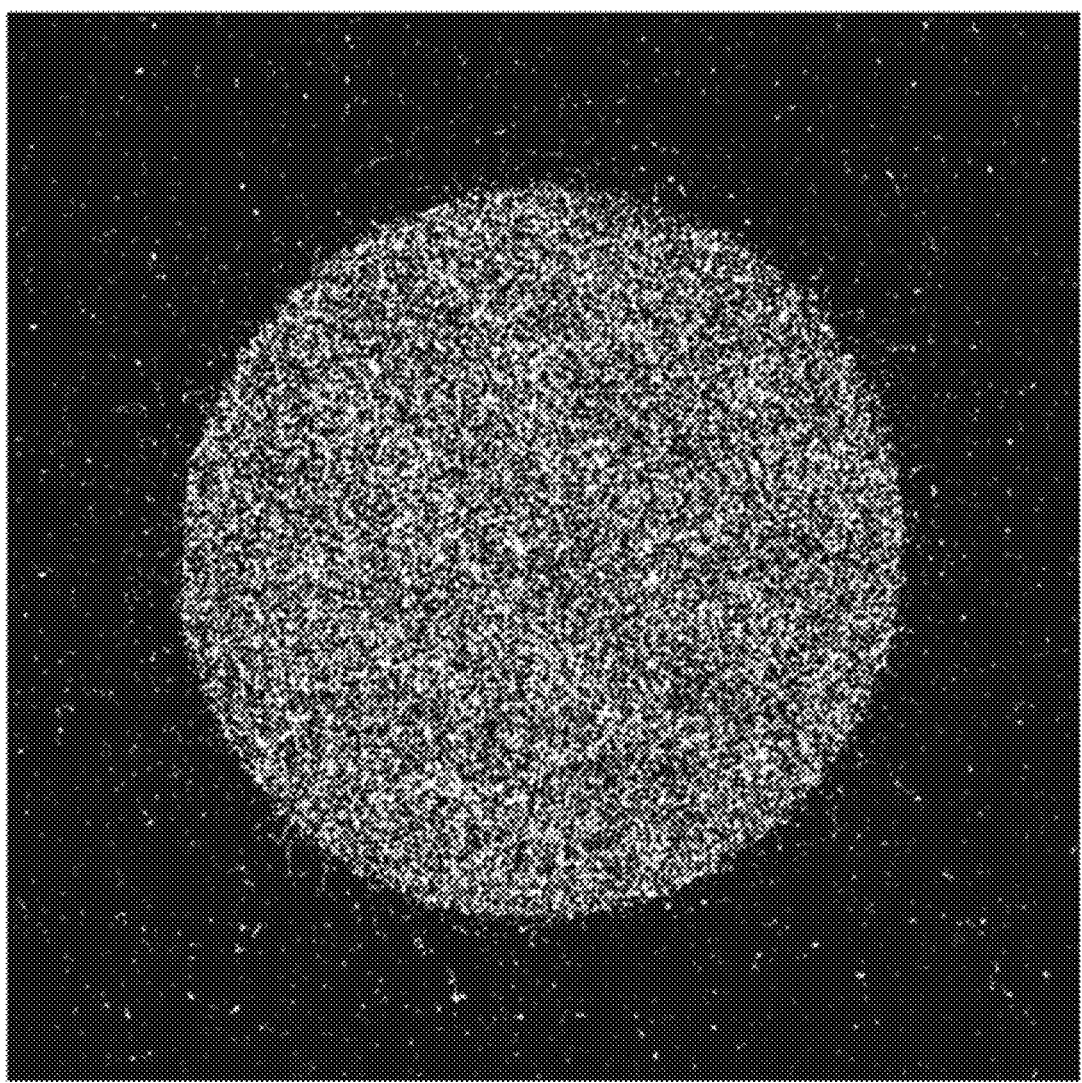
FIG. 10 is an image captured during a 4D STEM acquisition, according to one example.

A method will now be described with reference to FIG. 12 in view of FIG. 10 and FIG. 11.

Acquired images of a bright field disk are generally characterized by an intense disk ("bright-field disk") surrounded by sparse electron events ("dark-field area"). A typical image in such a data set is shown in FIG. 10. In step 1502, a bright-field disk image can be acquired.

Subtle misalignments or aberrations in the electron microscope can cause the bright-field disk to shift positions from one image to the next, as well as cause the disk to be distorted so that it is not perfectly circular. These shifts and distortions can introduce errors in the analysis and comparison of the bright-field disks in different images in each data set.

Therefore, these shifts and distortions can be corrected in each image so that the bright-field disk in all images in the dataset are consistent in overall shape and position within each image.

With reference again to FIG. 12 and step 1504, in order to correct the shifts and distortions, the bright-field disk can be binarized by applying a threshold to each image. In step 1506, the bright-field disks from several images corresponding to local regions of the specimen may be combined (by summing or averaging) to reduce effects of noise or specimen-induced distortions. Then in step 1508, an ellipse can be fit to the edge of the bright-field disk and the geometric distortion is corrected using standard distortion-correction methods. Next, a linear translation can be applied to each original image so that the centroid of the binarized bright-field disk of each image (or group of images) in the dataset is in the same position in all images in the dataset.

In step 1510, with the shifts and distortions corrected, a radial profile of each image in the dataset is calculated. In step 1512, the radial profile for each corrected image in the dataset can be normalized by the average intensity of the bright-field disk (that is, the value of the radial profile near zero), or the average intensity of the dark-field area (that is, the value of the radial profile at the maximum radius), or a combination of the two.

Figure 11:
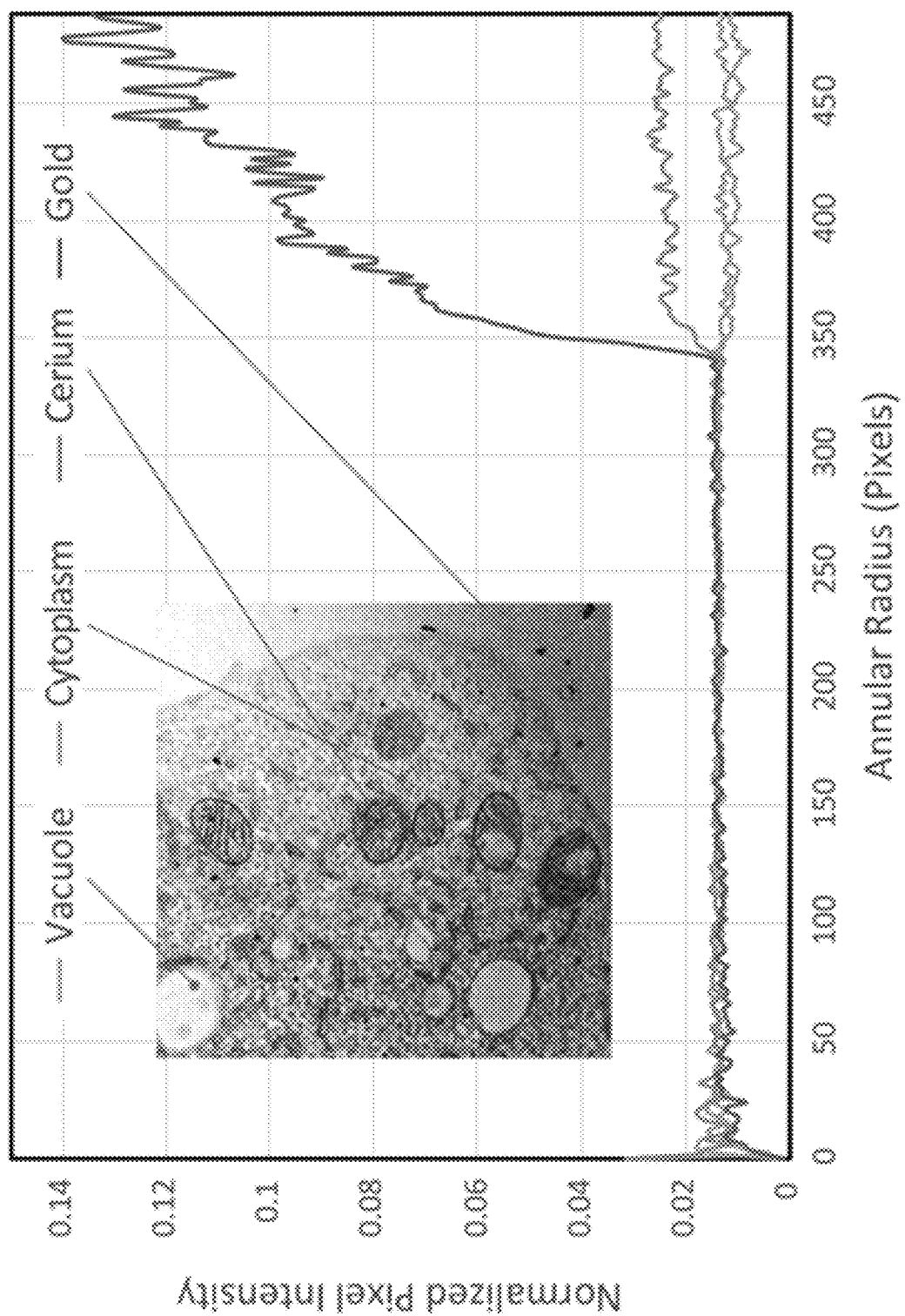
FIG. 11 is a graphical representation of a radial profile of an image captured during a 4D STEM acquisition, according to one example.

Exemplary radial profiles, normalized by the average intensity of the bright-field disk, are shown in FIG. 11.

For each image, the goal is to determine the characteristics of the edge profile of the bright-field disk in each image, such that the edge profile from each image in the series can be compared and grouped by similarity. In one embodiment, each image in the 4D STEM data stack is classified according to the average slope of the edge profile of the bright-field disk. In another embodiment, each image in the 4D STEM data stack is classified according to the maximum slope of the edge profile of the bright-field disk. In another embodiment, each image in the 4D STEM data stack is classified by comparing the edge profile of the bright-field disk to theoretical or empirically-derived models of the edge profile for certain elemental compositions. In another embodiment, each image in the 4D STEM data stack is classified by machine learning techniques using the edge profile of the bright-field disk.

As described above, in step 1514 for each image, the slope of the normalized radial profile at the edge of the bright-field disk can be calculated. In step 1516, the slope for each image can then be used to characterize each corresponding position on the specimen. This can be done either by forming a reconstructed image of the specimen using the slope values at each point on the specimen, or by grouping the slope values into several discrete groups in order to label each position on the specimen.

According to an embodiment, the slope of the bright-field disk can also be combined with other information from the images in the dataset, such as the total or average intensity of some or all of the dark-field area.

According to an embodiment, in order to improve the signal-to-noise ratio (SNR) of the dark-field area in each image, an electron counting algorithm may be applied to the sparse dark-field area, such that each "blob" in the dark-field area is normalized in intensity and/or size.

Figure 12:
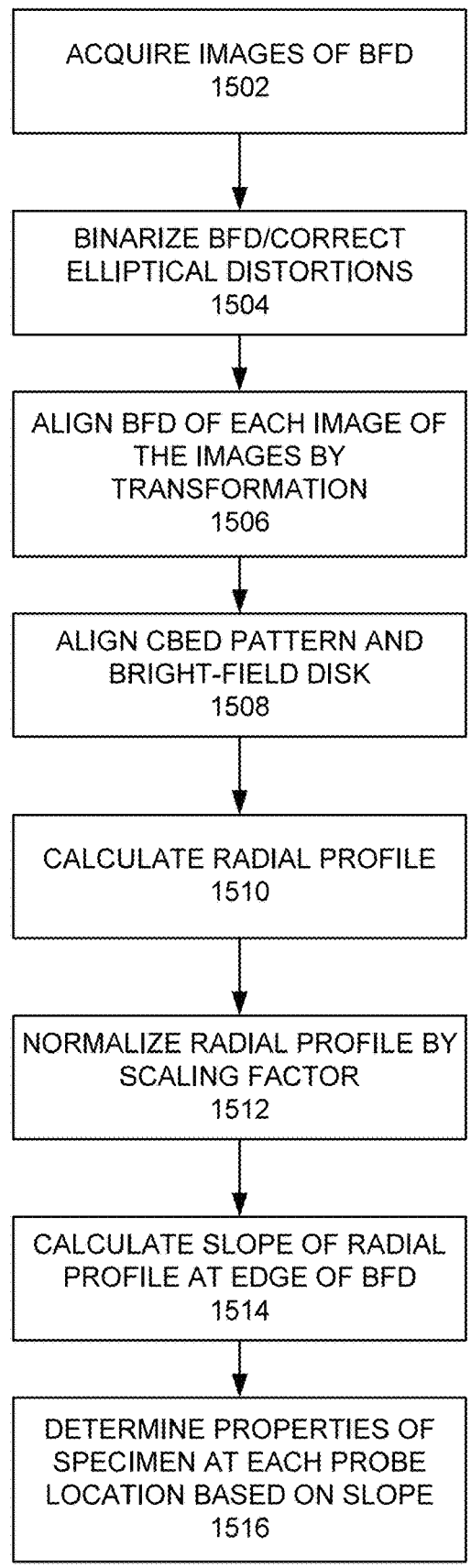
FIG. 12 is a flow diagram of a method of processing an image acquired via 4D STEM, according to one example.

Again, with reference to FIG. 12, the MAPS 102 is used to acquire images of the convergent beam electron diffraction (CBED) pattern, also known as the bright-field (BF) disk, in a scanning transmission electron microscopy (4D STEM). Additionally, the detector acquires information from the dark field around the BF disk.

To correct elliptical distortions that often occur in the CBED pattern/BF disk, either throughout a data set or from probe position to probe position, an ellipse or other shape may be fit to the edge of the CBED pattern/BF disk either in individual frames or a combination of multiple frames and this fit used to either warp the image to create a circular disk so that a rotational average may be calculated or used directly to calculate an average following the shape of the ellipse or other shape.

To correct variations in the location of the center of the CBED pattern/BF disk that may occur from probe position to probe position before averaging or calculating radial averages, an alignment step may be used to register the centers to the same coordinate. This alignment step may consist of finding the centroid of the BF disk.

The rotational profile of the CBED pattern/BF disk, extending from the optical axis across the BF disk edge and into the dark-field area, can be calculated for each frame or combination of frames. The rotational profiles may be normalized by a scaling factor, such as the average intensity of the CBED pattern/BF disk.

The slope of the rotationally-average edge profile of the CBED pattern/BF disk can be calculated and used either by itself or together with other information such as the intensity of the dark field, the intensity of the bright field, or other values derived from the BF and DF, to determine the properties of the specimen at each probe position.

This method is useful for distinguishing elemental composition of the specimen using 4D STEM (single-shot multicolor EM). Other methods of distinguishing elemental composition of the specimen based on the shape of the radial profile can include (1) grouping the radial profile of the edge of the bright-field disk by similarity using root-mean-squared differences, dynamic time warping, or Fréchet distance, (2) classifying the radial profile of the edge of the bright-field disk by K-means or other machine-learning classification methods, or (3) comparing the radial profile of the edge of the bright-field disk to a dictionary of radial profiles characteristic of different elements.

Figure 13D:
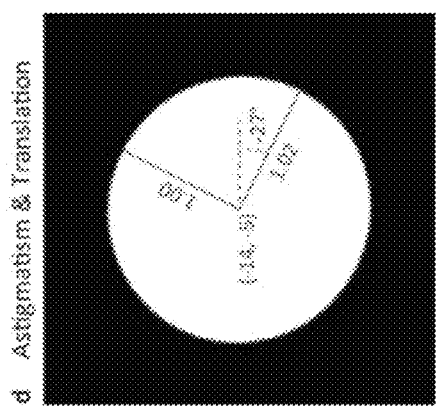
FIG. 13D is an image of a bright-field disk reflecting nearby probe positions and fit to an ellipse to determine position and elliptical distortion of the bright-field disk, according to one example.
Figure 13C:
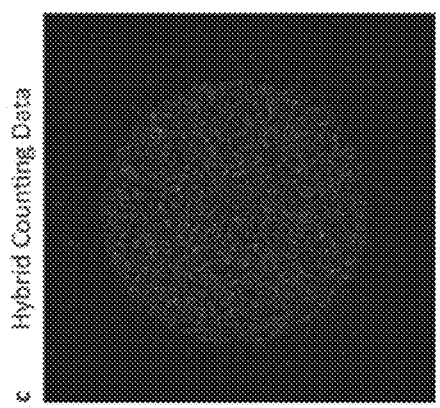
FIG. 13C is an image of a frame after performing electron counting in sparse areas of a frame and scaling by an average pixel value per primary electron on a detector, according to one example.
Figure 13B:
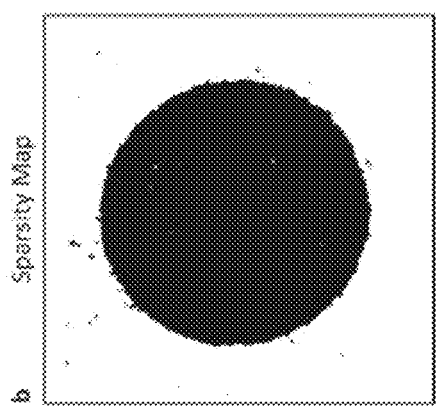
FIG. 13B is an image of a sparsity map indicating areas of a frame where primary electrons were insufficiently sparse to perform electron counting, according to one example.
Figure 13A:
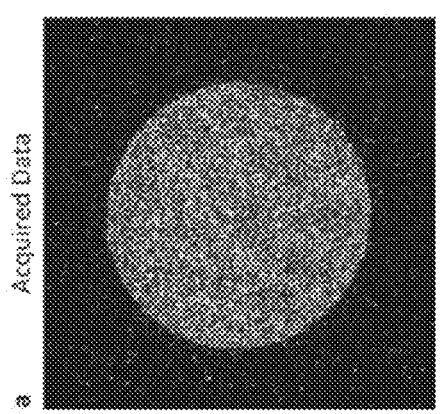
FIG. 13A is an image of a single frame acquired via 4D STEM, showing the bright-field disk in the center and the surrounding dark-field area at a single probe position on a specimen, according to one example.

FIG. 13A through 13D are exemplary illustrations of an analysis of 4D STEM data from the MAPS 102 according to one example. FIG. 13A is a signal from the detector showing the bright field disk in the center and surrounding dark-field area at a single STEM probe position on the specimen. The number of pixels can be used as a threshold for a primary electron event in each neighborhood of each frame to calculate a 'sparsity map', as shown in FIG. 13B, indicating areas of the frame where the primary electrons were sufficiently sparse to perform electron counting. After performing electron counting in sparse areas of each frame, the non-sparse areas of each frame can be scaled by the average pixel value per primary electron on the detector. The resulting frame is a hybrid between electron counting and integrating-mode data, as shown in FIG. 13C, such that the signal-to-noise ratio is optimized. Bright field disks in nearby STEM probe positions can be averaged and then fit to an ellipse in order to determine the position and elliptical distortions of the bright field disk, as shown in FIG. 13D. Annular integrations can then be performed based on this.

Figures 14A, 14B, 14C, 14D:
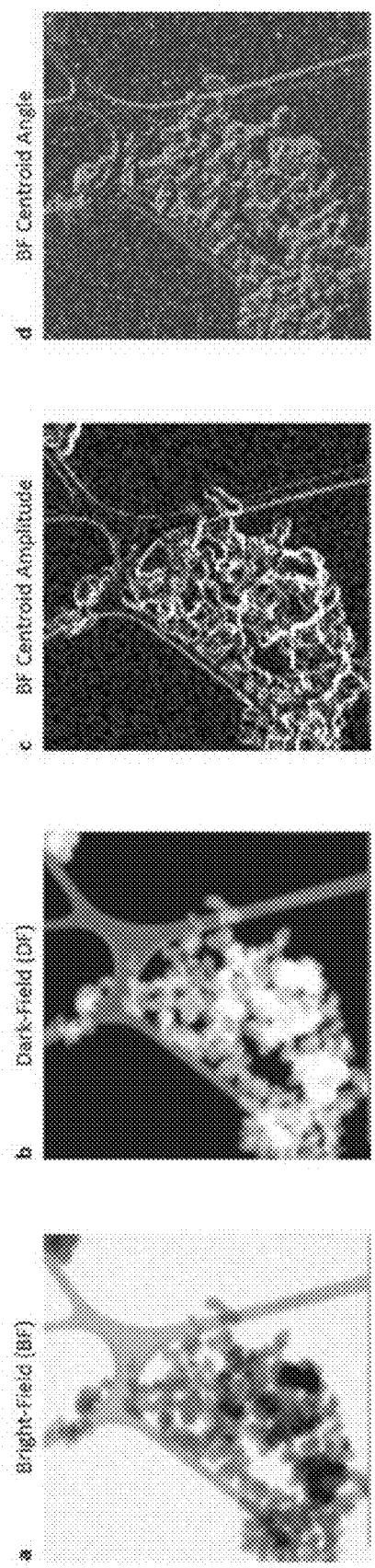
FIG. 14A is an image of a bright-field reconstruction using the total integrated intensity of the bright-field disk at each probe position on a specimen, according to one example.
FIG. 14B is an image of a dark-field reconstruction using the total integrated intensity outside of a bright-field disk and up to the edge of the pixelated detector, according to one example.
FIG. 14C is an image of a reconstruction where each pixel represents the amplitude of the centroid of the bright-field disk, according to one example.
FIG. 14D is an image of a reconstruction where each pixel represents an angle of a centroid of the bright-field disk, according to one example.

FIG. 14A through 14D are exemplary illustrations of 4D STEM reconstructions of graphitized carbon according to one example. FIG. 14A is a bright-field reconstruction using the total integrated intensity in the bright-field disk at each STEM probe position on the specimen. FIG. 14B is a dark-field reconstruction using the total integrated intensity outside of the bright-field disk up to the edge of the pixelated detector. FIG. 14C is a reconstruction where each pixel represents the amplitude of the centroid of the bright-field disk. At specimen positions where primary electrons have a preferred direction of scattering, the centroid amplitude will be large. Similarly, FIG. 14D is a reconstruction where each pixel represents the angle of the centroid of the bright field disk. Red corresponds to 0° (pointing right).

Figure 15:
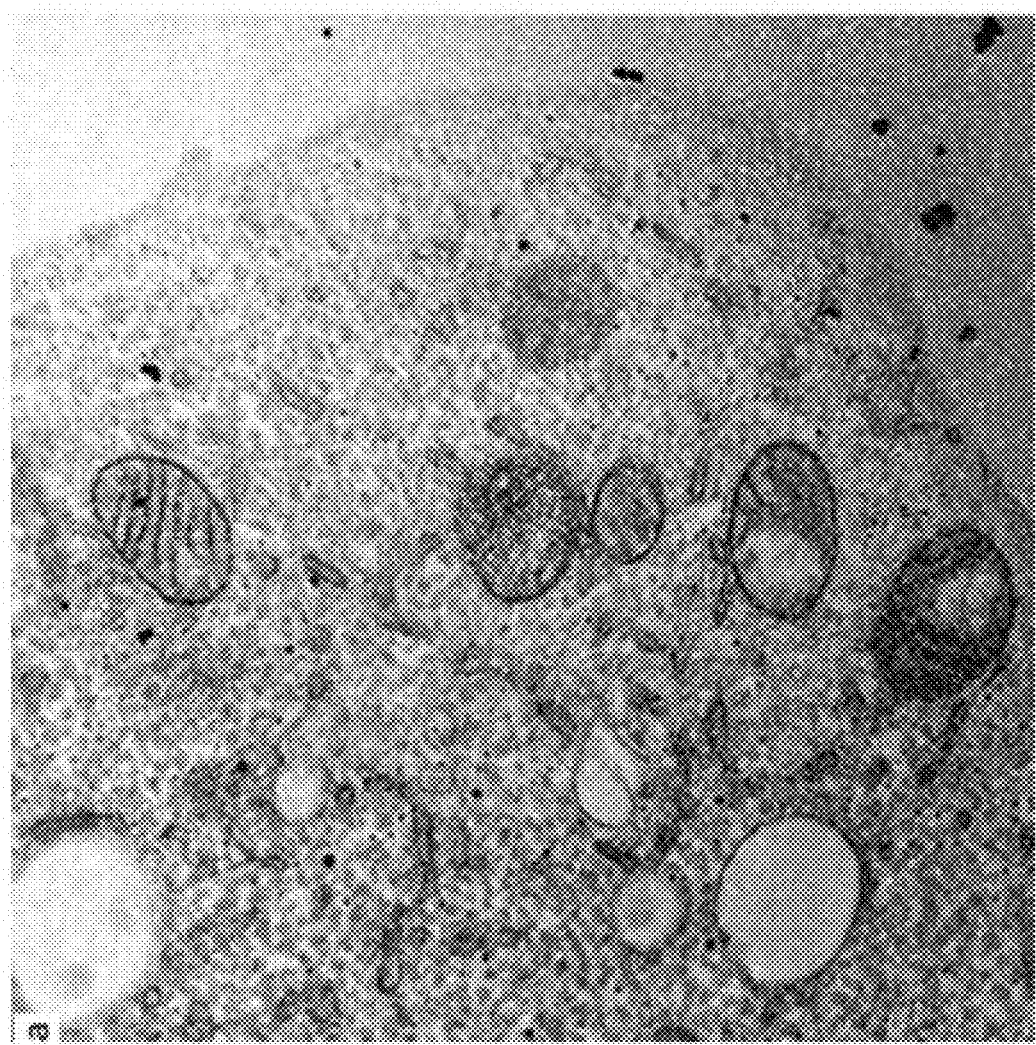
FIG. 15 is an image of an elemental map of cerium using EFTEM, according to one example.
Figure 16:
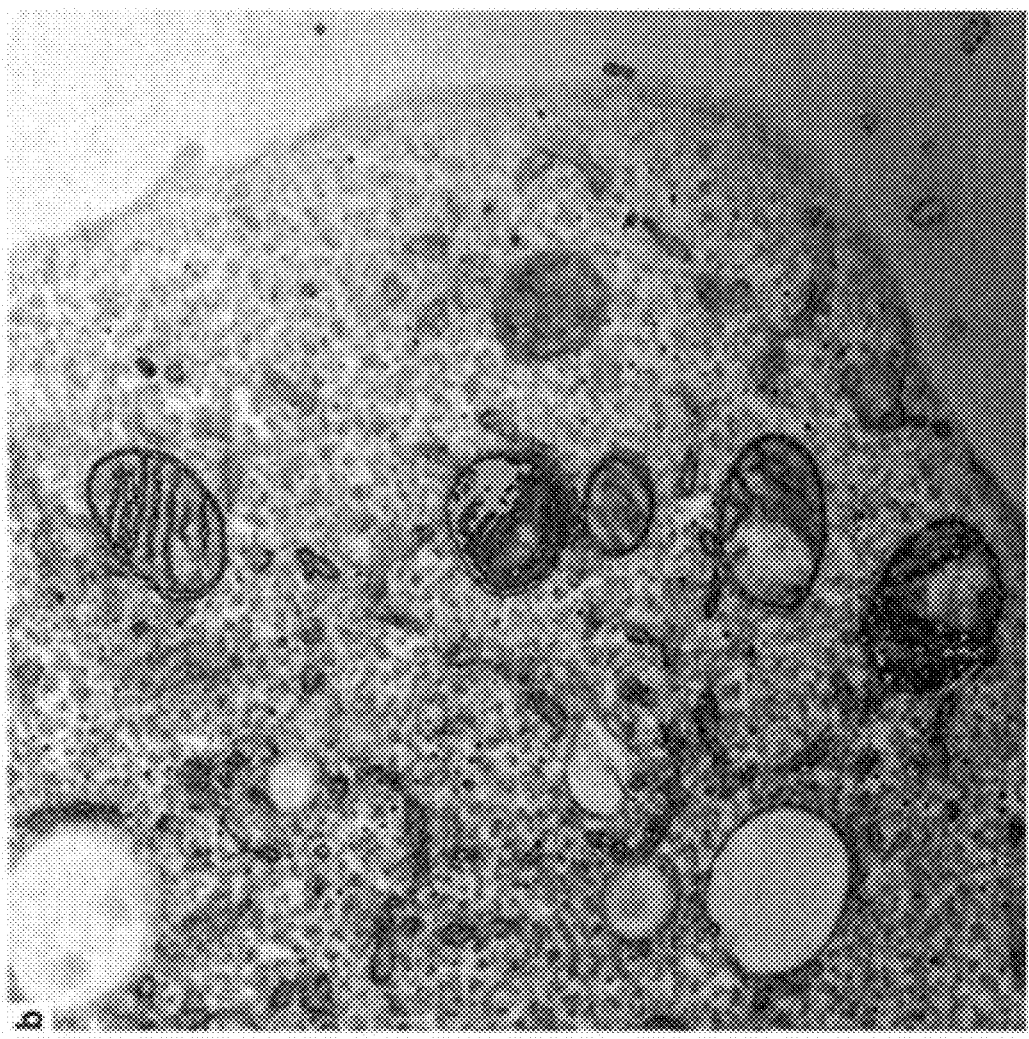
FIG. 16 is an image of a bright-field reconstruction with cerium locations and gold locations, according to one example.

FIG. 15 and FIG. 16 provide non-limiting exemplary results of a use of the 4D STEM system of the present disclosure according to one example.

In an exemplary embodiment, cellular mitomatrix sample can be used, labeled with Cerium-DAB, Ruthenium tetroxide, and 30 nm gold nanoparticles. EFTEM can be used as a baseline for validation of the new 4D STEM based technique. EFTEM was performed with a JEM-3200EFTEM (JEOL, Japan) operating at 300 kV, equipped with an in-column Omega filter and a LaB6 electron source.

The EFTEM images of the pre- and post-edges can be obtained using a slit of 30 eV width. Conventional bright-field TEM images and EFTEM elemental maps can be acquired using a conventional CCD camera. Elemental maps could then be generated.

STEM imaging was performed with a Titan Halo (Thermo Fisher, Waltham, Mass.) operating at 300 kV, equipped with bright-field and HAADF STEM detectors and a high-current XFEG electron source. 4D STEM data was acquired using a camera length of 150 mm and spot size 8 on a DE-16 direct detection camera (Direct Electron), with hardware frame synchronization with the DE-FreeScan STEM scan generator (Direct Electron). Although the DE-FreeScan is capable of acquiring STEM data using arbitrary or subsampled scan patterns, it was operated in a conventional full raster scanning mode. The DE-16 was operated at 342 frames per second (fps), no hardware binning, and a readout area of 1024×1024 pixels. 4D STEM data was processed using newly-developed DE-4DExplorer GPU-accelerated software (Direct Electron). Briefly, the software loads the 4D STEM data stack from disk and then performs standard flatfield (dark and gain) correction. Subsequently, the software calculates the sparsity map for each frame, which is a binary mask corresponding to regions of the frame where the number of primary electrons per pixel is low enough to be processed using electron counting. Based on this sparsity map, the software performs electron counting on sparse regions and scales the intensity of non-sparse regions based on the average pixel intensity per primary electron. Thus, the pixel intensity in the final processed frame approximately corresponds to the actual number of primary electrons incident on each pixel in each frame.

Using this data, 4D STEM analysis was completed by calculating the integrated intensity (total number of primary electrons) within every possible annular disk from the center of diffraction to the edge of the detector. However, the bright-field disk was not precisely centered on our pixelated detector (i.e., the center was moved slightly at different STEM probe positions and the BFD had a slight ellipticity). To correct these diffraction distortions, the bright-field disk was averaged over 16×16 STEM pixel areas on the specimen, and then fit with an ellipse to the edge of the average bright-field disk. Then, for each frame, the bright-field disk was translationally aligned and its ellipticity was corrected prior to further processing to generate reconstructions of the specimen.

After correcting for distortions in the diffraction patterns, the cerium labels and gold nanoparticles were distinguished based on the radial scattering profile. For instance, the radial scattering profile may be normalized by the average bright-field signal so that the scattering profile of all specimen pixels begins at unity. Next, the annular bright-field and dark-field parts of each scattering profile curve may be fit to a linear equation. Parameters of such fitted linear equations may be used to perform k-means clustering in order to group specimen pixels into four distinct groups. Results were similar to EFTEM results, shown in FIG. 15, but the 4D STEM results showed higher contrast, as in FIG. 16. The same data was also used to simultaneously generate bright-field and dark-field images of the specimen at significantly higher resolution than is possible through fluorescence light microscopy. Because all of these reconstructions were generated from a single STEM acquisition, the 4D STEM-based multi-color EM technique has significantly better throughput than is possible with the previous EFTEM-based multi-color EM technique.

Next, a hardware description of the control device according to exemplary embodiments is described with reference to FIG. 17. In FIG. 17, the control device includes a CPU 2000 which performs the processes described above. The process data and instructions may be stored in memory 2002. These processes and instructions may also be stored on a storage medium disk 2004 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the control device communicates, such as a server or computer.

Further, the claimed advancements may be provided as a utility application, background daemon, or component of an operating system, or combination thereof, executing in conjunction with CPU 2000 and an operating system such as Microsoft Windows 10, UNIX, Solaris, LINUX, Apple MAC-OS and other systems known to those skilled in the art.

The hardware elements in order to achieve the control device may be realized by various circuitry elements, known to those skilled in the art. For example, CPU 2000 may be a Xenon or Core processor from Intel of America or an Opteron processor from AMD of America, or may be other processor types that would be recognized by one of ordinary skill in the art. Alternatively, the CPU 2000 may be implemented on an FPGA, ASIC, PLD or using discrete logic circuits, as one of ordinary skill in the art would recognize. Further, C P U 2000 may be implemented as multiple processors cooperatively working in parallel to perform the instructions of the inventive processes described above.

The control device in FIG. 17 also includes a network controller 2006, such as an Intel Ethernet PRO network interface card from Intel Corporation of America, for interfacing with network 2050. As can be appreciated, the network 2050 can be a public network, such as the Internet, or a private network such as an LAN or WAN network, or any combination thereof and can also include PSTN or ISDN sub-networks. The network 2050 can also be wired, such as an Ethernet network, or can be wireless such as a cellular network including EDGE, 3G and 4G wireless cellular systems. The wireless network can also be WiFi, Bluetooth, or any other wireless form of communication that is known.

The control device further includes a display controller 2008, such as a NVIDIA GeForce GTX or Quadro graphics adaptor from NVIDIA Corporation of America for interfacing with display 2010, such as a Hewlett Packard HPL2445w LCD monitor. A general purpose I/O interface 2012 interfaces with a keyboard and/or mouse 2014 as well as a touch screen panel 2016 on or separate from display 2010. General purpose I/O interface 2012 also connects to a variety of peripherals 2018 including any peripherals appropriate for electron microscopy.

A sound controller 2020 is also provided in the control device, such as Sound Blaster X-Fi Titanium from Creative, to interface with speakers/microphone 2022 thereby providing sounds and/or music.

The general purpose storage controller 2024 connects the storage medium disk 2004 with communication bus 2026, which may be an ISA, EISA, VESA, PCI, or similar, for interconnecting all of the components of the control device. A description of the general features and functionality of the display 2010, keyboard and/or mouse 2014, as well as the display controller 2008, storage controller 2024, network controller 2006, sound controller 2020, and general purpose I/O interface 2012 is omitted herein for brevity as these features are known.

The described systems and methods are summarized as follows.

In one embodiment, a first system for determining the structure and/or elemental composition of a specimen includes: an electron source configured to direct an electron beam towards a sample; an electron detector comprised of an array of detector elements; and processing circuitry configured to acquire, from the electron detector, images using global shutter readout such that each image from the detector is synchronized with external events.

In said embodiment, the first system is further comprised of circuitry configured to scan the electron beam over the sample as a probe.

In said embodiment, the electron source and electron detector is part of a transmission electron microscope (TEM).

In said embodiment, the electron source and electron detector is part of a scanning transmission electron microscope (STEM).

In said embodiment, the electron source and electron detector is part of a scanning electron microscope (SEM).

In said embodiment, the electron detector includes an array of pixels configured to directly convert charges from impinging electrons to an electronic signal.

In said embodiment, the volume ratio of the depletion region associated with charge integration is more than 800 times larger than the depletion region associated with the sense node.

In said embodiment, the area of the sense node is 1.25% or less than the areas of the charge integration region.

In said embodiment, the electron detector includes an array of pixels configured to detect light produced by a scintillator when electrons impinge on it.

In said embodiment, the electron detector is a front-side illuminated monolithic active pixel sensor.

In said embodiment, the electron detector is a back-side illuminated monolithic active pixel sensor.

In said embodiment, the electron detector is a hybrid pixel active pixel sensor.

In said embodiment, the electron detector operates such that the start of electron signal integration and the end of electron signal integration is precisely the same for all pixels.

In said embodiment, random sections of the detector are not readout.

In said embodiment, pseudo-random sections of the detector are not readout.

In said embodiment, periodic sections of the detector are not readout.

In another embodiment, a second system for determining the structure and/or elemental composition of a specimen includes: an electron source configured to direct an electron beam towards a sample; an electron detector comprised of an array of detector elements; and processing circuitry configured to readout non-contiguous sections from the detector.

In said embodiment, the electron source and electron detector is part of a transmission electron microscope (TEM).

In said embodiment, the electron source and electron detector is part of a scanning transmission electron microscope (STEM).

In said embodiment, the electron source and electron detector is part of a scanning electron microscope (SEM).

In said embodiment, the electron detector includes an array of pixels configured to directly convert charges from impinging electrons to an electronic signal.

In said embodiment, the electron detector includes an array of pixels configured to detect light produced by a scintillator when electrons impinge on it.

In said embodiment, the electron detector is a front-side illuminated monolithic active pixel sensor.

In said embodiment, the electron detector is a back-side illuminated monolithic active pixel sensor.

In said embodiment, the electron detector is a hybrid pixel active pixel sensor.

In said embodiment, the electron detector operates with global shutter readout.

In said embodiment, the electron detector operates with rolling shutter readout.

In said embodiment, random sections of the detector are not readout.

In said embodiment, pseudo-random sections of the detector are not readout.

In said embodiment, periodic sections of the detector are not readout.

In said embodiment, non-contiguous sections of the detector are not readout and missing information is in-painted during an image processing step.

In said embodiment, wherein non-contiguous sections of the detector are not readout and missing information is ignored during an image processing step.

In another embodiment, a third system for determining the structure and/or elemental composition of a specimen using 4D STEM includes: an electron source configured to direct an electron beam towards a sample; circuitry configured to scan the electron beam over the sample as a probe; an electron detector comprised of an array of detector elements; and processing circuitry configured to acquire, from the electron detector, images of bright-field disks and the surrounding dark field diffraction, calculate radial profiles of the corrected images, normalize the radial profiles by a scaling factor, characterize the shape of the radial profiles at an edge of the bright-field disk, and determine elemental composition based on the radial profile at the edge of the bright-field disk in each image.

In said embodiment, the detector is operated with global shutter readout such that each image from the detector is synchronized with STEM probe movement.

In said embodiment, non-contiguous sections of the detector are not readout and missing information is in-painted during an image processing step.

In said embodiment, non-contiguous sections of the detector are not readout and missing information is ignored during an image processing step.

In said embodiment, the third system further includes the step of correcting geometric distortions in the images by fitting an ellipse to the bright-field disk.

In said embodiment, the third system further includes the step of aligning each bright-field disk image of the images based on a centroid of the bright-field disk.

In said embodiment, the third system further includes the step of aligning each bright-field disk image of the images based on the geometric center of the edge of the bright-field disk.

In said embodiment, the third system further includes the step of calculating the radial profiles of the corrected images In said embodiment, the third system further includes the step of normalizing the radial profiles by the average intensity of the bright-field disk.

In said embodiment, the third system further includes the step of normalizing the radial profiles by the average intensity of the dark-field area.

In said embodiment, the third system further includes the step of normalizing the radial profiles by a combination of average intensity of both the bright-field disk and the dark-field area.

In said embodiment, the shape of radial profiles is characterized by the slope of the radial profile of the transition between bright-field and dark-field areas.

In said embodiment, the shape of radial profiles is characterized by the mutual similarity between the radial profiles of the transition between bright-field and dark-field areas in different images.

In said embodiment, the shape of radial profiles is characterized by the similarity of the edge profile of the transition between bright-field and dark-field areas to pre-existing models of the edge profile.

Obviously, numerous modifications and variations are possible in light of the above teachings. It is therefore to be understood that within the scope of the appended claims, the invention may be practiced otherwise than as specifically described herein.

Embodiments of the present disclosure may also be as set forth in the following parentheticals.

(1) A method for determining material properties of a sample using 4D STEM, including: directing an electron beam from an electron source toward the sample; detecting electrons of the electron beam interacting with the sample via an electron detector including an array of detector elements; acquiring, from the electron detector, images of bright-field disks and surrounding dark-field diffraction based on the detected electrons; and determining an elemental composition of the sample based on the acquired images of the bright-field disks and the surrounding dark-field diffractions.

(2) The method of (1), further comprising: correcting distortions in the acquired images.

(3) The method of (2), wherein the determining of the elemental composition of the sample based on the acquired images of the bright-field disks and the surrounding dark-field diffractions further comprises: calculating a radial profile of the distortion-corrected acquired images; normalizing the radial profile by a scaling factor; determining a shape of the radial profile at an edge of the bright-field disks; and determining the elemental composition based on the shape of the radial profile at the edge of the bright-field disks.

(4) The method of either (2) or (3), wherein the distortions in the acquired images are geometric and the correcting of the geometric distortions includes fitting an ellipse to the bright-field disks.

(5) The method of (3), wherein the radial profile is normalized based on an average intensity of the bright-field disks.

(6) The method of any one of (1) to (5), wherein the detecting detects the electrons using the electron detector in a global shutter readout mode, and synchronizes each acquired image from the electron detector with a movement of a probe directing the electron beam.

(7) The method of any one of (1) to (6), further comprising: aligning each image of the images of the bright-field disks with one another based on a center of each of the bright-field disks.

(8) The method of (3), where the shape of the radial profile corresponds to a slope of the radial profile for a transition between areas of the bright-field disks and the surrounding dark-field diffractions.

(9) A method for compressive readout using an electron microscope, including: generating a row address table including a first set of a truncated number of row addresses and a frame height, the truncated number of the row addresses being fewer than a possible maximum number of row addresses in the frame height; transmitting each row address of the truncated number of row addresses in the row address table to a controller, the controller configured to control an electron source to direct a beam of electrons onto a sample and read out charge from an electron detector including an array of detector elements, the electron detector configured to detect electrons of the electron beam; controlling the controller to read out along the transmitted row addresses; determining whether a last row address in the row address table has been read out; upon determining that the last row address in the row address table has not been read out, incrementing a pointer to a next row address in the row address table and controlling the controller to read out along the next row address; and repeating the controlling and determining until the last row address in the row address table has been scanned.

(10) The method of (9), wherein the truncated number of row addresses in the row address table is truncated from the possible maximum number of row addresses in the frame height by skipping a randomized selection of row addresses.

(11) The method of either (9) or (10), wherein the truncated number of row addresses in the row address table is truncated from the possible maximum number of row addresses in the frame height by skipping a periodic selection of row addresses.

(12) The method of any one of (9) to (11), wherein the generating of the row address table includes generating a second set of the truncated number of row addresses, the second set of the truncated number of row addresses being included in the row address table following the first set of the truncated number of row addresses, at least one row address of the second set of the truncated number of row addresses being different from the row addresses of the first set of the truncated number of row addresses.

(13) The method of any one of (9) to (12), further comprising: acquiring, from the electron detector, a first image based on the truncated number of row addresses read out from the electron detector; and generating a second image, the second image being an expanded reconstruction based on the first image.

(14) A system for determining material properties of a sample, including: an electron detector including an array of detector elements configured to convert charges from impinging electrons to an electronic signal; and processing circuitry configured to read out the electronic signal from each detector element of the array of detector elements in a global shutter mode.

(15) The system of (14), wherein the electron detector is a direct electron detector configured to directly convert the charges from the impinging electrons to the electronic signal.

(16) The system of (15), wherein a volume ratio of a first depletion region associated with charge integration is greater than 200 times that of a second depletion region associated with a sense node.

(17) The system of (15), wherein an area of a sense node is 5% or less than an area of a charge integration region.

(18) The system of any one of (14) to (17), wherein the array of detector elements is positioned so that a front side of the array of detector elements detects the impinging electrons.

(19) The system of any one of (14) to (18), wherein the electron detector is a hybrid pixel active pixel sensor.

(20) The system of any one of (14) to (19), wherein the processing circuitry is further configured to exclude a predetermined number of row addresses during read out of the electronic signal from each detector element of the array of detector elements in the global shutter mode.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for determining material properties of a sample using 4D STEM, comprising:
    directing an electron beam from an electron source toward the sample;
    detecting electrons of the electron beam interacting with the sample via an electron detector including an array of detector elements;
    acquiring, from the electron detector, images of bright-field disks and surrounding dark-field diffraction based on the detected electrons; and
    determining an elemental composition of the sample based on the acquired images of the bright-field disks and the surrounding dark-field diffractions,
    wherein the detecting detects the electrons using the electron detector in a global shutter readout mode, and synchronizes each acquired image from the electron detector with a movement of a probe directing the electron beam.

2. The method according to claim 1, further comprising:
    correcting distortions in the acquired images.

3. The method according to claim 2, wherein the determining of the elemental composition of the sample based on the acquired images of the bright-field disks and the surrounding dark-field diffractions further comprises:
    calculating a radial profile of the distortion-corrected acquired images;
    normalizing the radial profile by a scaling factor;
    determining a shape of the radial profile at an edge of the bright-field disks; and
    determining the elemental composition based on the shape of the radial profile at the edge of the bright-field disks.

4. The method according to claim 2, wherein the distortions in the acquired images are geometric and the correcting of the geometric distortions includes fitting an ellipse to the bright-field disks.

5. The method according to claim 3, wherein the radial profile is normalized based on an average intensity of the bright-field disks.

6. The method according to claim 1, further comprising:
    aligning each image of the images of the bright-field disks with one another based on a center of each of the bright-field disks.

7. The method according to claim 3, where the shape of the radial profile corresponds to a slope of the radial profile for a transition between areas of the bright-field disks and the surrounding dark-field diffractions.

* * * * *